(12) United States Patent
Ikada et al.

(10) Patent No.: US 9,070,488 B2
(45) Date of Patent: Jun. 30, 2015

(54) CONDUCTIVE COMPOSITION, METHOD OF PRODUCING THE SAME, CONDUCTIVE MEMBER, TOUCH PANEL, AND SOLAR CELL

(71) Applicant: FUJIFILM Corporation, Minato-ku, Tokyo (JP)

(72) Inventors: Tomotake Ikada, Ashigarakami-gun (JP); Kentaro Okazaki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/220,230

(22) Filed: Mar. 20, 2014

(65) Prior Publication Data

US 2014/0203223 A1 Jul. 24, 2014

Related U.S. Application Data

(63) Continuation of application No. PCT/JP2012/072789, filed on Sep. 6, 2012.

(30) Foreign Application Priority Data

Sep. 28, 2011 (JP) .................. 2011-212875

(51) Int. Cl.
| | |
|---|---|
| *H01B 1/22* | (2006.01) |
| *H01B 1/02* | (2006.01) |
| *B32B 15/08* | (2006.01) |
| *C09D 5/24* | (2006.01) |
| *C09D 7/12* | (2006.01) |
| *C09D 201/00* | (2006.01) |
| *G06F 3/041* | (2006.01) |
| *H01B 1/00* | (2006.01) |

(52) U.S. Cl.
CPC *H01B 1/02* (2013.01); *B32B 15/08* (2013.01); *C09D 5/24* (2013.01); *C09D 7/12* (2013.01); *C09D 201/00* (2013.01); *G06F 3/041* (2013.01); *H01B 1/00* (2013.01); *H01B 1/22* (2013.01)

(58) Field of Classification Search
CPC ............ H01B 1/02; H01B 1/22; H01B 13/00; H01B 5/14; B32B 15/08; C09D 1/00; C09D 5/24; C09D 7/12
USPC ........................................................ 252/514
See application file for complete search history.

(56) References Cited

U.S. PATENT DOCUMENTS

| | | | |
|---|---|---|---|
| 2007/0074316 A1 | 3/2007 | Alden et al. | |
| 2009/0321634 A1 | 12/2009 | Khursheed | |
| 2010/0078197 A1* | 4/2010 | Miyagishima et al. .... | 174/128.1 |

FOREIGN PATENT DOCUMENTS

| | | | |
|---|---|---|---|
| JP | 2006299391 A | * | 11/2006 |
| JP | 2009-129732 A | | 6/2009 |
| JP | 2010-84173 A | | 4/2010 |

OTHER PUBLICATIONS

International Search Report for PCT/JP2012/072789 dated Oct. 9, 2012, 2 pages.
Written Opinion for PCT/JP2012/072789 dated Oct. 9, 2012, 12 pages.
Office Action dated Mar. 24, 2015, issued by the Japanese Patent Office in counterpart Japanese Application No. 2011-212875.

* cited by examiner

*Primary Examiner* — Harold Pyon
*Assistant Examiner* — Danny N Kang
(74) *Attorney, Agent, or Firm* — Sughrue Mion, PLLC

(57) ABSTRACT

A conductive composition includes: a) metal conductive fibers having an average minor axis length of from 1 nm to 150 nm; and b) at least one compound selected from the group consisting of a monosaccharide and a derivative thereof, in an amount of from 0.005% by mass to 0.05% by mass with respect to the metal conductive fibers.

15 Claims, 1 Drawing Sheet

CONDUCTIVE COMPOSITION, METHOD OF PRODUCING THE SAME, CONDUCTIVE MEMBER, TOUCH PANEL, AND SOLAR CELL

CROSS-REFERENCE TO RELATED APPLICATIONS

This application is a continuation application of International Application No. PCT/JP2012/072789, filed Sep. 6, 2012, the disclosure of which is incorporated herein by reference in its entirety. Further, this application claims priority from Japanese Patent Application No. 2011-212875, filed Sep. 28, 2011, the disclosure of which is incorporated herein by reference in their entirety.

TECHNICAL FIELD

The present invention relates to a conductive composition, a method of producing the same, a conductive member, a touch panel, and a solar cell.

BACKGROUND ART

ITO is widely utilized as a conductive material for electrodes that are used in display devices such as liquid crystal displays, organic EL's and touch panels, and in integrated type solar cells and the like. However, there are problems such as the small reserves of indium metal, the color tinge caused by low transmittance in the long-wavelength region, the need for a high temperature heat treatment for reduction of resistance, and the lack of flexibility.

Under such circumstances, an investigation of a conductive member using a metal nanowire has been reported (U.S. Patent Publication No. 2007/0074316), and from the viewpoint of excellent transparency, excellent low resistance and excellent reduction of the amount of metal used, there is an increasing expectation of using metal nanowire in place of ITO. However, problems have been found regarding metal nanowire such as the haze value being high due to its wire structure; heat resistance being insufficient due to the specific surface area of the metal being high; and, even though practical durability cannot be obtained unless coating of a photocurable resin or the like is applied to the outermost layer that contacts air, the occurrence of an increase in resistance and a decrease in uniformity in the in-plane resistance as a result of the coating.

Among these, an improvement in haze characteristics is one important problem, and attempts have been made to provide a solution by sufficiently eliminating impurities by, for example, an ultrafiltration method or the like (U.S. Patent Publication No. 2009/0321634 and Japanese Patent Application Laid-Open (JP-A) No. 2009-129732); however, it cannot be said that the effects thereof are sufficient, and a further improvement is desired.

SUMMARY OF INVENTION

Technical Problem

The invention has been made in view of such circumstances, and an object of the invention is to provide a conductive composition that contains a metal conductive fiber such as a metal nanowire and that is capable of providing a conductive layer having a low haze, a method of producing the same, a conductive member, a touch panel, and a solar cell.

Solution to Problem

The invention that solves the problems described above is as follows.

<1> A conductive composition comprising:
a) metal conductive fibers having an average minor axis length of from 1 nm to 150 nm; and
b) at least one compound selected from the group consisting of a monosaccharide and a derivative thereof, in an amount of from 0.005% by mass to 0.05% by mass with respect to the metal conductive fibers.

<2> The conductive composition according to <1>, wherein the metal conductive fibers comprise metal nanowires.

<3> The conductive composition according to <1> or <2>, wherein the derivative of the monosaccharide is an oxide of the monosaccharide.

<4> The conductive composition according to any one of <1> to <3>, wherein the monosaccharide is glucose.

<5> The conductive composition according to any one of <1> to <4>, wherein the metal conductive fibers comprise silver nanowires.

<6> A method of producing a conductive composition comprising: a) metal conductive fibers having an average minor axis length of from 1 nm to 150 nm, and b) at least one compound selected from the group consisting of a monosaccharide and a derivative thereof, in an amount of from 0.005% by mass to 0.05% by mass with respect to the metal conductive fibers, the method comprising:
1) preparing a reaction product comprising metal nanowires by reduction of a metal salt in the presence of at least one compound selected from the group consisting of a monosaccharide and a derivative thereof; and
2) washing the reaction product such that a residual amount of the at least one compound selected from the group consisting of a monosaccharide and a derivative thereof is in a range of from 0.005% by mass to 0.05% by mass with respect to the metal nanowires.

<7> The method of producing a conductive composition according to <6>, wherein the washing is carried out by ultrafiltration.

<8> The method of producing a conductive composition according to <6> or <7>, wherein the reduction is carried out in an aqueous medium.

<9> The method of producing a conductive composition according to any one of <6> to <8>, wherein the metal nanowires are silver nanowires.

<10> A conductive member comprising a base material, and a conductive layer that is provided on the base material and contains the conductive composition according to any one of <1> to <5>.

<11> The conductive member according to <10>, wherein a surface resistance of the conductive layer is 1000 Ω/square or less.

<12> The conductive member according to <10> or <11>, wherein the conductive layer includes a conductive region and a non-conductive region.

<13> The conductive member according to any one of <10> to <12>, further comprising at least one intermediate layer between the base material and the conductive layer.

<14> A touch panel comprising the conductive member according to any one of <10> to <13>.

<15> A solar cell comprising the conductive member according to any one of <10> to <13>.

Advantageous Effects of Invention

According to the invention, a conductive composition that is capable of providing a conductive layer having a low haze, a method of producing the same, a conductive member, a touch panel, and a solar cell are provided.

DESCRIPTION OF EMBODIMENTS

Figure 1:
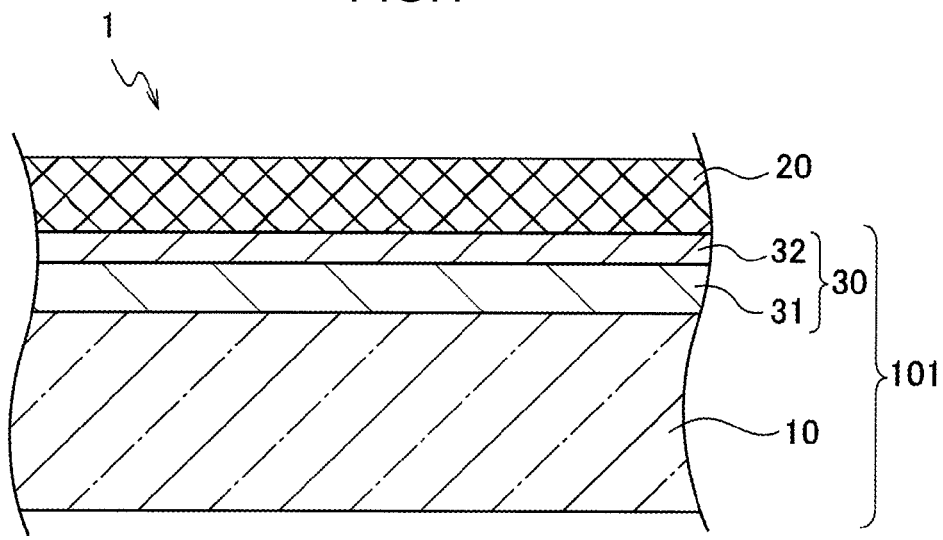
FIG. 1 is a schematic cross-sectional diagram of the conductive member according to a first exemplary embodiment of the invention.

Hereinafter, the conductive composition and conductive member according to the invention are described in detail.

Hereinafter, the invention is described by way of representative exemplary embodiment, but as long as the gist of the invention is maintained, the invention is not intended to be limited the exemplary embodiments described.

In the present specification, the numerical value range represented by using the symbol "~ (to)" means a range including the numerical values described before and after the symbol "~" as the lower limit and the upper limit, respectively.

The term "light" as used in the present specification is used as a concept which includes not only visible light, but also high energy radiations such as ultraviolet radiation, X-radiation and gamma-radiation, particle beams such as an electron beam, and the like.

In the present specification, the expression "(meth)acrylic acid" may be used to indicate either or both of acrylic acid and methacrylic acid, and the expression "(meth)acrylate" may be used to indicate either or both of acrylate and methacrylate.

Furthermore, unless particularly stated otherwise, the content is indicated in terms of mass, and unless particularly stated otherwise, the unit "% by mass" represents a proportion with respect to the total amount of the composition. The term "solid content" means components excluding the solvent in the composition.

<<<Conductive Composition>>>

The conductive composition according to the invention contains: a) metal conductive fibers having an average minor axis length of from 1 nm to 150 nm, and b) at least one compound selected from the group consisting of a monosaccharide and a derivative thereof, in an amount of from 0.005% by mass to 0.05% by mass with respect to the metal conductive fibers.

<Metal Conductive Fibers Having Average Minor Axis Length of from 1 nm to 150 nm>

The metal conductive fibers having an average minor axis length of 150 nm or less may have any of a solid structure, a porous structure and a hollow structure, but a solid structure or a hollow structure is preferred. In the invention, fibers having a solid structure may be referred to as wires, and fibers having a hollow structure may be referred to as tubes.

The conductive material that forms the fibers is preferably a metal, and examples thereof include metal oxides such as ITO, zinc oxide and tin oxide; simple metal elements; core-shell structures formed from plural metal elements; and alloys formed from plural metals. Furthermore, the conductive material may be surface-treated after being formed into a fibrous form, and for example, plated metal fibers or the like can also be used.

(Metal Nanowires)

From the viewpoint that a transparent conductive layer is easily formed, it is preferable to use metal nanowires as the metal conductive fibers. It is preferable that the metal nanowires according to the invention are, for example, metal fine particles having an aspect ratio (average major axis length/average minor axis length) of 30 or more, the average minor axis length of from 1 nm to 150 nm, and the average major axis length of from 1 μm to 100 μm.

The average minor axis length (average diameter) of the metal nanowires is preferably 100 nm or less, and more preferably 30 nm or less. When the average minor axis length is too small, there is a case that oxidation resistance is deteriorated and durability may deteriorated, therefore, it is preferable that the average minor axis length is 5 nm or more. When the average minor axis length is greater than 150 nm, there is a risk that a decrease in conductivity or deterioration of optical characteristics caused by light scattering may occur, thus it is not preferable.

The average major axis length (may be referred to as "average length") of the metal nanowires is preferably 1 μm to 40 μm, more preferably 3 μm to 35 μm, and even more preferably 5 μm to 30 μm. When the average major axis length of the metal wires is too long, there is a risk that aggregates may be generated at the time of production of the metal nanowires, and when the average major axis length is too short, there is a case that sufficient conductivity is not obtained.

Here, the average minor axis length (average diameter) and the average major axis length of the metal nanowires can be determined by, for example, observing a TEM image or an optical microscopic image using a transmission electron microscope (TEM) or an optical microscope. In the invention, the average minor axis length (average diameter) and the average major axis length of the metal nanowires were determined by observing 300 metal nanowires using a transmission electron microscope (TEM: manufactured by JEOL, Ltd., JEM-2000FX), and determining the average axis lengths of the metal nanowires from the average values. The minor axis length in the case in which the cross-section in the minor axis direction of the metal nanowires is not circular, the length of the longest site as measured in the minor axis direction was designated as the minor axis length. Also, when the metal nanowires are bent, a circle having an arc equivalent to the bent wire is contemplated, and the value calculated from the radius and curvature of the circle was taken as the major axis length.

In the invention, metal nanowires having an average minor axis length (diameter) of 150 nm or less and a major axis length of from 5 μm to 500 μm are preferably contained in an amount of metal of 50% by mass or more in the total amount of the conductive fibers, more preferably 60% by mass or more, and even more preferably 75% by mass or more.

When the proportion of the metal nanowires having an average minor axis length (diameter) of 150 nm or less and a length of from 5 μm to 500 μm included is an amount of 50% by mass or more, sufficient conductivity is obtained, voltage concentration less likely to occur, and a decrease in durability caused thereby can be suppressed, which is therefore preferable. When conductive particles other than fibrous particles are included in the photosensitive layer, there is risk that transparency may decrease in the case of having strong plasmon absorption, and therefore it is not preferable.

The coefficient of variation of the average minor axis length (diameter) of the metal nanowires that are used in the conductive layer according to the invention is preferably 40% or less, more preferably 35% or less, and even more preferably 30% or less.

When the coefficient of variation exceeds 40%, since it is assumed that voltage is concentrated on fine wires having a small average minor axis length (diameter), there is a case that durability may be deteriorated.

The coefficient of variation of the average minor axis length (diameter) of the metal nanowires can be determined by, for example, measuring the average minor axis length (diameter) of 300 nanowires from transmission electron microscopic (TEM) images, and calculating the standard deviation and average value thereof.

The aspect ratio of the metal conductive fibers used in the invention is preferably 10 or greater. The aspect ratio generally means the ratio of a longer side to a shorter side (ratio of average major axis length/average minor axis length) of a fibrous substance.

The method of measuring the aspect ratio is not particularly limited and can be appropriately selected according to the purpose. For example, a method of measuring the aspect ratio using an electron microscope or the like may be used.

When the aspect ratio of the metal conductive fibers is measured with an electron microscope, whether the aspect ratio of the metal conductive fibers is 10 or more may be determined in a single viewing field of the electron microscope. Furthermore, the aspect ratio of the entire metal conductive fibers can be speculated by measuring the average major axis length and the average minor axis length of the metal conductive fibers individually.

When the metal conductive fibers are tube-shaped, the outer diameter of the tube is used as the diameter for calculating the aspect ratio.

The aspect ratio of the metal conductive fibers may be appropriately selected according to the purpose, and the aspect ratio is preferably 50 to 1,000,000, and more preferably 100 to 1,000,000.

When the aspect ratio is adjusted to 10 or greater, a network of the metal conductive fibers can be easily formed, and sufficient conductivity can be easily secured. Furthermore, when the aspect ratio is adjusted to 1,000,000 or less, at the time of formation of the metal conductive fibers or handling thereafter, a stable liquid can be obtained easily without having the metal conductive fibers being entangled.

Regarding the shape of the metal nanowires, for example, arbitrary shape such as a cylindrical shape, a cuboid shape, or a pillar shape having a polygonal cross-section may be adopted, but for applications where high transparency is required, a cylindrical shape or a shape having a cross-section which is a polygon being pentagonal or more and does not have an acute-angled angle, is preferred.

The cross-sectional shape of the metal nanowires can be inspected by applying an aqueous dispersion liquid of the metal nanowires onto a base material, and observing the cross-section with a transmission electron microscope (TEM).

There are no particular limitations on the metal for the metal nanowires, and any metal may be used. One kind of metal may be used, or two or more kinds of metals may be used in combination, and metals can also be used as alloys. Among these, the metal nanowires are preferably formed from a metal or a metal compound, and more preferably formed from a metal.

As the metal, at least one metal selected from the group consisting of the metals of the 4th period, the 5th period, and the 6th period of the Long Periodic Table (IUPAC 1991) is preferred; at least one metal selected from the group consisting of Group 2 to Group 14 is more preferred; at least one metal selected from the group consisting of Group 2, Group 8, Group 9, Group 10, Group 11, Group 12, Group 13 and Group 14 is even more preferred; and it is particularly preferable that the metal include these metals as a main component.

Specific examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. Among these, copper, silver, gold, platinum, palladium, nickel, tin, cobalt, rhodium, iridium and alloys thereof are preferred; palladium, copper, silver, gold, platinum, tin and alloys thereof are more preferred; and silver or an alloy containing silver is particularly preferred.

(Method of Producing Metal Nanowires)

The metal nanowires may be produced by any method without any particular limitations, but it is preferable to produce the metal nanowires by reducing metal ions in a solvent in which a halogen compound and a dispersant are dissolved, as described below. Furthermore, once the metal nanowires are formed, it is preferable to carry out a desalting treatment by a conventional method, from the viewpoints of dispersibility, and stability over time of the photosensitive layer.

Furthermore, as the method of producing metal nanowires, the methods described in JP-A Nos. 2009-215594, 2009-242880, 2009-299162, 2010-84173, 2010-86714 and the like can be used.

As the solvent used in the production of the metal nanowires, hydrophilic solvents are preferred, and examples thereof include water, alcohols, ethers, and ketones. These may be used singly, or two or more kinds may be used in combination.

Examples of alcohols include methanol, ethanol, propanol, isopropanol, butanol, and ethylene glycol.

Examples of ethers include dioxane and tetrahydrofuran.

Examples of ketones include acetone.

When heating is performed, the heating temperature is preferably 250° C. or lower, more preferably from 20° C. to 200° C., even more preferably from 30° C. to 180° C., and particularly preferably from 40° C. to 170° C. When the temperature is 20° C. or higher, the length of the metal nanowires thus formed is in a preferred range by which dispersion stability can be secured, and when the temperature is 250° C. or lower, the outer circumference of the cross-section of the metal nanowires has a smooth shape that does not have acute-angled angles, and therefore, it is suitable from the viewpoint of transparency.

If necessary, the temperature may be changed during the process of particle formation, and there is a case that the change of temperature in the mid-course is effective in improvement of monodispersibility as a result of the control of nucleation, suppression of renucleation, and promotion of selective growth.

At the time of the heating described above, it is preferable to perform the heating by adding a reducing agent.

There is no particular limitation on the reducing agent, and the reducing agent can be appropriately selected from such as those that are conventionally used. Examples thereof include metal borohydride salts, aluminum hydride salts, alkanolamines, aliphatic amines, heterocyclic amines, aromatic amines, aralkylamines, alcohols, organic acids, reducing sugars, sugar alcohols, sodium sulfite, hydrazine compounds, dextrin, hydroquinone, hydroxylamine, ethylene glycol, and glutathione. Among these, reducing sugars, sugar alcohols as derivatives thereof, and ethylene glycol are particularly preferred.

Among these, reducing sugars are preferred, and among them, glucose is more preferred.

Among the reducing agents, there are compounds which also function as dispersants or solvents, and these compounds can be used preferably in the same manner.

At the time of production of the metal nanowires, it is preferable to carry out the production by adding a dispersant and a halogen compound or metal halide particles.

The timing of the addition of the dispersant and the halogen compound may be before the addition or after the addition of the reducing agent, or may be before the addition or after the addition of metal ions or metal halide particles. However, in order to obtain nanowires having superior monodispersibility, two or more separate-steps of the process of addition of the halogen compound is preferable for controlling nucleation and growth.

Regarding the stage of the addition of the dispersant, the addition may be performed before the preparation of particles, and the addition may be performed in the presence of a dispersant, or may be performed for the control of the dispersed state after particle preparation. When the process of addition of the dispersant is divided into two or more steps, it is necessary to change the amount depending on the required length of the metal wires. This is because the length of the metal wires are considered to result from the control of the amount of metal particles serving as nuclei.

Examples of the dispersant include amino group-containing compounds, thiol group-containing compounds, sulfide group-containing compounds, amino acids or derivatives thereof, peptide compounds, and polymers such as polysaccharides, natural polymers derived from polysaccharides, synthetic polymers, and gels derived therefrom. Among these, the various polymer compounds that are used as dispersants are compounds that are included in (b) polymer that are described below.

Preferred examples of polymers that are suitably used as the dispersant include polymers having a hydrophilic group, such as gelatin, polyvinyl alcohol, methyl cellulose, hydroxypropyl cellulose, polyalkyleneamine, partial alkyl esters of polyacrylic acid, polyvinylpyrrolidone, copolymers containing a polyvinylpyrrolidone structure, and polyacrylic acid having an amino group or a thiol group, which are polymers having protective colloid properties.

The polymer used as the dispersant preferably has a weight average molecular weight (Mw) measured by GPC of from 3000 to 300,000, and more preferably from 5000 to 100,000.

In regard to the structure of the compound that can be used as the dispersant, reference can be made to the descriptions of, for example, "Ganryo no Jiten (Dictionary of Pigments)" (edited by Seishiro Itoh, published by Asakura Publishing Co., Ltd., 2000).

The shape of the metal nanowires to be obtained can be changed depending on the kind of the dispersant used.

The halogen compound is not particularly limited as long as it is a compound containing bromine, chlorine or iodine, and the halogen compound can be appropriately selected according to the purpose. Preferred examples thereof include alkali halides such as sodium bromide, sodium chloride, sodium iodide, potassium iodide, potassium bromide, potassium chloride, and potassium iodide; and compounds that can be used in combination with the dispersion additives described below.

Among the halogen compounds, there may be compounds which function as dispersion additives, and those compounds can be preferably used in the same manner.

As an alternative of the halogen compound, silver halide particles may be used, or a halogen compound and silver halide particles may be used together.

Furthermore, a single substance having the functions of both the dispersant and the halogen compound may also be used. That is, when a halogen compound having the function as a dispersant is used, a single compound exhibits the functions of both the dispersant and the halogen compound.

Examples of the halogen compound having the function as a dispersant include HTAB (hexadecyltrimethylammonium bromide) containing an amino group and bromide ion; HTAC (hexadecyltrimethylammonium chloride) containing an amino group and chloride ion; dodecyltrimethylammonium bromide, dodecyltrimethylammonium chloride, stearyltrimethylammonium bromide, stearyltrimethylammonium chloride, decyltrimethylammonium bromide, decyltrimethylammonium chloride, dimethyldistearylammonium bromide, dimethyldistearylammonium chloride, dilauryldimethylammonium bromide, dilauryldimethylammonium chloride, dimethyldipalmitylammonium bromide, and dimethyldipalmitylammonium chloride, which all contain an amino group, and bromide ion or chloride ion.

A desalting treatment after the formation of the metal nanowires can be carried out by techniques such as ultrafiltration, dialysis, gel permeation, decantation, and centrifugation.

It is preferable that the metal nanowires do not contain an inorganic ion such as an alkali metal ion, an alkali earth metal ion or a halide ion, as much as possible. The electrical conductivity when the metal nanowires are formed into an aqueous dispersion is preferably 1 mS/cm or less, more preferably 0.1 mS/cm or less, and even more preferably 0.05 mS/cm or less.

The viscosity at 20° C. when the metal nanowires are formed into an aqueous dispersion is preferably from 0.5 mPa·s to 100 mPa·s, and more preferably from 1 mPa·s to 50 mPa·s.

Besides the metal nanowires, preferred examples of metal conductive fibers include metal nanotubes which are hollow fibers.

(Metal Nanotubes)

There are no particular limitations on the material of the metal nanotubes, and any metal may be used. For example, the materials for the metal nanowires described above and the like can be used.

The shape of the metal nanotubes may be a single layer or a multilayer, and from the viewpoint of having excellent electrical conductivity and thermal conductivity, a single layer is preferred.

The thickness of the metal nanotubes (difference between the outer diameter and the inner diameter) is preferably from 3 nm to 80 nm, and more preferably from 3 nm to 30 nm.

When the thickness is 3 nm or greater, sufficient oxidation resistance is obtained, and when the thickness is 80 nm or less, the occurrence of light scattering that is attributed to the metal nanotubes is suppressed.

It is required that the average minor axis length of the metal nanotubes is 150 nm or less, similar to that of the metal nanowires. A preferred average minor axis length thereof is the same as that of the metal nanowires. Furthermore, the major axis length is preferably from 1 μm to 40 μm, more preferably from 3 μm to 35 μm, and even more preferably from 5 μm to 30 μm.

The method of producing the metal nanotubes is not particularly limited and can be appropriately selected according to the purpose. For example, the methods described in U.S. Patent Publication No. 2005/0056118 and the like can be used.

The conductive composition according to the invention contains, together with metal conductive fibers having an average minor axis length of from 1 nm to 150 nm, at least one compound selected from the group consisting of a monosaccharide and a derivative thereof (hereinafter, also called a "specific compound") in an amount of from 0.005% by mass to 0.05% by mass with respect to the metal conductive fibers. When the amount of the specific compound with respect to the amount of the metal conductive fibers is smaller than 0.005% by mass or is larger than 0.05% by mass, the haze value is increased, and the effects according to the invention is not obtained.

Preferred examples of the monosaccharide include glucose and fructose. Examples of the derivative of a monosaccharide include an oxide of a monosaccharide, a halide of a monosaccharide, an oligomer of a monosaccharide, and a polymer of a monosaccharide.

A method in which the monosaccharide or derivative thereof is added after the metal conductive fibers are prepared, and then the amount is adjusted so as to be from 0.005% by mass to 0.05% by mass with respect to the metal conductive fibers may also be used. It is preferable from the viewpoint of production efficiency that a process of preparing metal nanowires as metal conductive fibers, that is, preparing a reaction product containing an aqueous dispersion liquid of metal nanowires by reducing a metal salt in an aqueous medium in the presence of a monosaccharide; and a washing process of eliminating an inorganic ion such as an alkali metal ion, an alkali earth metal ion or a halide ion, which is a side product, from the reaction product, is carried out such that the residual amount of the monosaccharide or oxide thereof that has existed at the time of reduction is in the range of from 0.005% by mass to 0.05% by mass with respect to the metal nanowires.

Since an aqueous dispersion liquid of metal nanowires obtained by reducing a metal salt in an aqueous medium in the presence of a monosaccharide contains impurities such as a reducing agent and derivatives of the reducing agent, or an excess amount of dispersant, when a conductive member provided with a conductive layer is produced by applying the aqueous dispersion liquid as it is onto a base material and drying, the contact between wires is interrupted by the impurities contained in the conductive layer, whereby conductivity is decreased. Therefore, it is general to prevent a decrease in conductivity described above, by eliminating impurities (washing) by a centrifugation method, a gel permeation method, an ultrafiltration method or the like. At that time, it is preferable to eliminate impurities as much as possible as long as there is no adverse effect such as that aggregation between wires occurs as a result of eliminating the dispersant more than necessary.

In the invention, at the time of preparation of the metal nanowires, when the amount of the monosaccharide or a derivative thereof that is used as a reducing agent in a dispersion of the metal nanowires after the washing process for impurities elimination is from 0.005% by mass to 0.05% by mass with respect to the metal nanowires, a conductive layer with a low haze value can be obtained while adverse effects caused by impurities such as described above are prevented. Regarding the adjustment of a residual amount of the monosaccharide or an oxide thereof that has existed at the time of such reduction, for example, in the case of performing washing by ultrafiltration, adjustment can be carried out depending on the amount of the solvent used in the washing.

In the conductive composition according to the invention, an additional conductive material, for example, conductive particles or the like can be used in combination, in addition to the metal conductive fibers, to the extent that the effects of the invention are not impaired. From the viewpoint of effects, the proportion of the metal conductive fibers described above is preferably 50% or greater, more preferably 60% or greater, and particularly preferably 75% or greater, as a volume ratio in the composition for photosensitive layer-formation. The proportion of such metal conductive fibers may be hereinafter referred to as the "proportion of the metal conductive fibers".

When the proportion of the metal conductive fibers is less than 50%, the amount of the conductive substances that contribute to conductivity is decreased, whereby there is a case that conductivity is decreased. At the same time, since a tight network cannot be formed, voltage concentration occurs, whereby there is a case that durability is decreased. Particles having a shape other than the metal conductive fibers do not significantly contribute to conductivity, and even exhibit absorption, thus are not preferable. Particularly in the case of a metal, when the metal with a spherical shape or the like exhibits strong plasmon absorption, there is a case that transparency is deteriorated.

Here, regarding the proportion of the metal conductive fibers, for example, in a case in which the metal conductive fibers are silver nanowires, the proportion of the metal conductive fibers can be determined by filtering an aqueous dispersion liquid of silver nanowires, separating silver nanowires and other particles, and measuring, using an ICP atomic emission spectrometer, each of the amount of silver remaining on the filter paper and the amount of silver that has been passed through the filter paper. The metal conductive fibers remaining on the filter paper is observed by TEM, the average minor axis length of 300 metal conductive fibers is observed, and the distribution of the minor axis lengths is investigated, thereby obtaining the proportion of the metal conductive fibers.

The method of measuring the average minor axis length and the average major axis length of the metal conductive fibes is as described above.

A matrix described below may be further incorporated into the conductive composition.

<<<Conductive Member>>>

The conductive member according to the invention has, on a base material, a conductive layer containing at least a) metal conductive fibers having an average minor axis length of from 1 nm to 150 nm, and b) at least one compound selected from the group consisting of a monosaccharide and a derivative thereof, in an amount of from 0.005% by mass to 0.05% by mass with respect to the metal conductive fibers.

<<Base Material>>

As the base material, various materials can be used according to the purpose, as long as the material can carry the conductive layer. Generally, a plate-shaped base material or a sheet-shaped base material is used.

The base material may be transparent or may be opaque. Examples of the material that formes the base material include transparent glasses such as white sheet glass, blue sheet glass and silica-coated blue sheet glass; synthetic resins such as polycarbonates, polyether sulfones, polyesters, acrylic resins, vinyl chloride resins, aromatic polyamide resins, polyamideimides, and polyimides; metals such as aluminum, copper, nickel and stainless steel; other ceramics, and silicon wafers used in semiconductor substrates. A pretreatment such as a cleaning treatment using an alkaline aqueous solution, a chemical treatment using a silane coupling agent or the like, a plasma treatment, ion plating, sputtering, a gas phase reaction method, or vacuum vapor deposition can be optionally performed on the surfaces of these base materials at which a conductive layer is to be formed.

Regarding the thickness of the base material, a thickness in a preferable range is used depending on the use. Generally, the thickness is selected from the range of from 1 μm to 500 μm, and the thickness is more preferably from 3 μm to 400 μm, and even more preferably from 5 μm to 300 μm.

When transparency is required to the conductive member, the base material is selected from base materials having a total visible light transmittance of 70% or higher, more preferably 85% or higher, and even more preferably 90% or higher.

The conductive composition according to the invention is prepared into a coating liquid containing a solvent, and when the coating liquid is applied onto the surface of a base material to form a conductive layer, a conductive member can be obtained.

(Coating Liquid of Conductive Composition)

The conductive composition according to the invention preferably contains a solvent in order for the formation by coating on a preferable base material. In the production of metal conductive fibers, when an aqueous dispersion liquid in which the metal conductive fibers are dispersed in an aqueous medium is prepared using water as a solvent, the aqueous dispersion liquid may be used as it is, or the aqueous dispersion liquid may be prepared into a coating liquid by adjusting the content of water as a solvent.

When a solvent different from the solvent used in the preparation of the metal conductive fibers (for example, water), for example, an organic solvent such as propylene glycol monomethyl ether, propylene glycol monomethyl ether acetate, or the like is preferred as the solvent of the coating liquid of the conductive composition, solvent substitution of substituting the solvent used in the preparation of the metal conductive fibers (for example, water) with a preferable solvent (for example, propylene glycol monomethyl ether acetate) may be carried out. The concentration of the metal conductive fibers in the coating liquid described above is appropriately selected depending on the preferable thickness of the conductive layer, from the range of from 0.1% by mass to 10% by mass.

(Matrix)

The conductive layer of the conductive member may further contain a matrix. Here, the term "matrix" is a general name for materials that contain metal conductive fibers to form a layer, and a matrix has a function of maintaining the dispersion of metal conductive fibers in a stable manner. The matrix may be a non-photosensitive material, or may be a photosensitive material.

When the conductive layer is composed of metal conductive fibers alone, an embodiment in which an adhesive layer is provided on the base material in advance, and a conductive layer composed of metal conductive fibers alone is provided on the adhesive layer, is preferred. When the conductive layer contains a matrix, the dispersion of the metal conductive fibers in the conductive layer is stably maintained, and further, even in a case in which the conductive layer is formed on the base material surface without interposing an adhesive layer therebetween, strong adhesion between the base material and the conductive layer is secured, thus it is more preferable.

When the conductive layer contains a matrix, the content ratio of the matrix/metal conductive fibers is suitably in the range of from 0.001/1 to 100/1 in terms of mass ratio. When the content ratio is selected from the range, appropriate adhesive force of the conductive layer to the base material, and appropriate surface resistance are obtained. The content ratio of matrix/metal conductive fibers is more preferably in the range of from 0.01/1 to 20/1, even more preferably in the range of from 1/1 to 15/1, and particularly preferably in the range of from 2/1 to 8/1, in terms of mass ratio.

(Non-Photosensitive Matrix)

The non-photosensitive matrix is described. Suitable examples of the non-photosensitive matrix include a matrix containing an organic polymer or an inorganic polymer.

Examples of the organic polymer include polymers having high aromaticity, such as polymethacrylates (for example, polymethyl methacrylate, and copolymers containing polymethacrylic acid esters), polyacrylates (for example, polymethyl acrylate, and copolymers containing polyacrylic acid esters), polyacrylonitrile, polyvinyl alcohol, polyesters (for example, polyethylene terephthalate (PET), polyethylene naphthalate, and polycarbonate), phenol- or cresol-formaldehyde resins (for example, NOVOLACS (registered trademark)), polystyrene, polyvinyltoluene, polyvinylxylene, polyimides, polyamides, polyamideimide, polyether imide, polysulfide, polysulfone, polyphenylene, and polyphenyl ether; polyurethane (PU), epoxy resins, polyolefin (for example, polyethylene, polypropylene, and polycycloolefin), acrylonitrile-butadiene-styrene copolymers (ABS), cellulose derivatives, silicones, silicon-containing polymers (for example, polysilsesquioxane and polysilane), polyvinyl chloride (PVC), polyacetate, polynorbornene, synthetic rubbers (for example, EPR, SBR and EPDM), fluorine-containing polymers (for example, polyvinylidene fluoride, polytetrafluoroethylene (TFE), and polyhexafluoropropylene), hydrocarbon olefins (for example, "LUMIFLON" (registered trademark) manufactured by Asahi Glass Co., Ltd.), and amorphous fluorocarbon polymers or copolymers (for example, "CYTOP" (registered trademark) manufactured by Asahi Glass Co., Ltd., or "TEFLON" (registered trademark) AF manufactured by DuPont Company). However, the invention is not intended to be limited to these.

Examples of the inorganic polymer include a sol-gel cured product obtained by hydrolyzing and polycondensing an alkoxide compound of an element selected from the group consisting of Si, Ti, Zr and Al (hereinafter, also referred to as a "specific alkoxide compound"), and further optionally heating and drying.

As the sol-gel cured product, a product which has high resistance to scratches and abrasion is preferable from the viewpoint that the sol-gel cured product can be easily produced.

(Specific Alkoxide Compound)

The specific alkoxide compound in the invention is preferably a compound represented by the following Formula (1):

$$M(OR^p)_a R^q{}_{4-a} \quad (1)$$

wherein, in Formula (1), M represents an element selected from the group consisting of Si, Ti, Al and Zr; $R^p$ and $R^q$ each independently represent a hydrogen atom or a hydrocarbon group; and a represents an integer from 2 to 4.

Each of the hydrocarbon groups that can be represented by $R^p$ or $R^q$ in Formula (1) is preferably an alkyl group or an aryl group.

When the hydrocarbon group represents an alkyl group, the number of carbon atoms is preferably from 1 to 18, more preferably from 1 to 8, and even more preferably from 1 to 4. When the hydrocarbon group represents an aryl group, a phenyl group is preferred. Each of the alkyl group and aryl group may further have a substituent.

Specific examples of the compound represented by Formula (1) include such as those listed below, but the invention is not intended to be limited to these.

(Alkoxysilane)

Examples of the compound in which M is Si and a is 2, that is, a dialkoxysilane, include dimethyldimethoxysilane, diethyldimethoxysilane, propylmethyldimethoxysilane, dimethyldiethoxysilane, diethyldiethoxysilane, dipropyldiethoxysilane, γ-chloropropylmethyldiethoxysilane, acetoxymethylmethyldiethoxysilane, acetoxymethylmethyldimethoxysilane, phenylmethyldimethoxysilane, phenylethyldiethoxysilane, phenylmethyldipropoxysilane, vinylmethyldimethoxysilane, vinylmethyldiethoxysilane, vinylmethyldibutoxysilane, isopropenylmethyldimethoxysilane, isopropenylmethyldiethoxysilane, and isopropenylmethyldibutoxysilane. Among these, particularly preferred examples include, from the viewpoint of easy-availability and from the viewpoint of adhesiveness to a hydrophilic layer, dimethyldimethoxysilane, diethyldimethoxysilane, dimethyldiethoxysilane, and diethyldiethoxysilane.

Examples of the compound in which M is Si and a is 3, that is, a trialkoxysilane, include methyltrimethoxysilane, ethyltrimethoxysilane, propyltrimethoxysilane, methyltriethoxysilane, ethyltriethoxysilane, propyltriethoxysilane, chloromethyltriethoxysilane, vinyltrimethoxysilane, isopropenyltrimethoxysilane, and isopropenyltriethoxysilane. Among these, particularly preferred examples include, from the viewpoint of easy-availability and from the viewpoint of adhesiveness to a hydrophilic layer, methyltrimethoxysilane, ethyltrimethoxysilane, methyltriethoxysilane, and ethyltriethoxysilane.

Examples of the compound in which M is Si and a is 4, that is, a tetraalkoxysilane, include tetramethoxysilane, tetraethoxysilane, tetrapropoxysilane, tetrabutoxysilane, methoxytriethoxysilane, ethoxytrimethoxysilane, methoxytripropoxysilane, ethoxytripropoxysilane, propoxytrimethoxysilane, propoxytriethoxysilane, and dimethoxydiethoxysilane. Among these, particularly preferred examples include tetramethoxysilane and tetraethoxysilane.

(Alkoxy Titanate)

Examples of the compound in which M is Ti and a is 2, that is, as a dialkoxy titanate, include dimethyldimethoxy titanate, diethyldimethoxy titanate, propylmethyldimethoxy titanate, dimethyldiethoxy titanate, diethyldiethoxy titanate, dipropyldiethoxy titanate, phenylethyldiethoxy titanate, phenylmethyldipropoxy titanate, and dimethyldipropoxy titanate.

Examples of the compound in which M is Ti and a is 3, that is, a trialkoxy titanate, include methyltrimethoxy titanate, ethyltrimethoxy titanate, propyltrimethoxy titanate, methyltriethoxy titanate, ethyltriethoxy titanate, propyltriethoxy titanate, chloromethyltriethoxy titanate, phenyltrimethoxy titanate, phenyltriethoxy titanate, and phenyltripropoxy titanate.

Examples of the compound in which M is Ti and a is 4, that is, a tetraalkoxy titanate, include tetramethoxy titanate, tetraethoxy titanate, tetrapropoxy titanate, tetraisopropoxy titanate, and tetrabutoxy titanate.

(Alkoxide of Zirconium or Aluminum)

Examples of the compound in which M is Zr, that is, alkoxide of zirconium, include zirconates corresponding to the compounds exemplified as the compound containing titanium.

Examples of the compound in which M is Al, that is, alkoxide of aluminum, include trimethoxy aluminate, triethoxy aluminate, tripropoxy aluminate, and tetraethoxy aluminate.

These specific alkoxides are easily available as commercially available products, and may also be produced by a known synthesis method, for example, a reaction between various metal chlorides and arbitrary alcohols.

Regarding the alkoxides, one kind of compound may be used alone, or two or more kinds of compounds may be used in combination.

A conductive layer containing a sol-gel cured film as a matrix is preferably formed by applying, onto a base material, a water-containing solution containing metal conductive fibers and a specific alkoxide compound (hereinafter, also referred to as a "sol-gel coating liquid") to form a coating liquid film; causing reactions of hydrolysis and polycondensation of the specific alkoxide compound (hereinafter, these reactions of hydrolysis and polycondensation are also referred to as a "sol-gel reaction") in the coating liquid film; and further heating as necessary to evaporate water and dry. On the occasion of the preparation of the sol-gel coating liquid, a dispersion liquid of the metal conductive fibers may be prepared separately, and may be mixed with the specific alkoxide compound. A solution in a sol-state obtained by preparing a solution containing a specific alkoxide compound, and then heating the solution thus-prepared to cause hydrolysis and polycondensation of at least a part of the specific alkoxide compound to be in a sol state, is mixed with a dispersion liquid of metal conductive fibers, thereby preparing the sol-gel coating liquid.

(Catalyst)

In order to accelerate the sol-gel reaction, it is preferable to add an acidic catalyst or a basic catalyst. Hereinafter, the catalyst is described.

As the catalyst, any arbitrary compound can be used, as long as it accelerates the reactions of hydrolysis and polycondensation of the alkoxide compound.

Examples of such a catalyst include acids and basic compounds, and these compounds may be used as they are or in a state of being dissolved in a solvent such as water and an alcohol (hereinafter, these may be collectively referred to as acidic catalysts or basic catalysts, respectively).

There are no particular limitations on the concentration when an acid or a basic compound is dissolved in a solvent, and the concentration may be appropriately selected in accordance with the characteristics of the acid or basic compound, the preferable content of the catalyst, or the like. Here, when the concentration of the acid or basic compound that forms the catalyst is high, there is a tendency that the rates of hydrolysis and polycondensation tend to be faster. However, when a basic catalyst with an excessively high concentration is used, there is a case that a precipitate may be produced to develop defects in the conductive layer. Therefore, when a basic catalyst is used, the concentration is preferably 1 N or less in terms of the concentration in an aqueous solution.

The kind of the acidic catalyst or basic catalyst is not particularly limited, but when there is a need to use a catalyst with a high concentration, a compound which almost does not remain in the conductive layer after drying is preferred. Specific examples of acid catalysts include hydrogen halides such as hydrochloric acid, nitric acid, sulfuric acid, sulfurous acid, hydrogen sulfide, perchloric acid, hydrogen peroxide, carbonic acid, carboxylic acids such as formic acid and acetic acid, substituted carboxylic acids having a structural formula represented by RCOOH in which R is substituted with another element or substituent, and sulfonic acids such as benzenesulfonic acid. Examples of basic catalysts include ammoniacal bases such as aqueous ammonia, and amines such as ethylamine and aniline.

A Lewis acid catalyst containing a metal complex can also be preferably used. A particularly preferred catalyst is a metal complex catalyst, and is a metal complex formed from a metal element selected from the group consisting of Group 2, Group 13, Group 4 and Group 5 of the Periodic Table; and an oxo or hydroxyloxygen-containing compound selected from the group consisting of β-diketones, keto esters, hydroxycarboxylic acids or esters thereof, amino alcohols, and enolic active hydrogen compounds.

Among the constituent metal elements, elements of Group 2 such as Mg, Ca, St and Ba; elements of Group 13 such as Al and Ga; elements of Group 4 such as Ti and Zr; and elements of Group 5 such as V, Nb and Ta are preferred, and they respectively form complexes having excellent catalyst effects. Among them, catalysts obtained from Zr, Al and Ti are excellent and preferable.

In the invention, examples of the oxo or hydroxyloxygen-containing compound that forms a ligand of the metal complex include β-diketones such as acetylacetone (2,4-pentanedione) and 2,4-heptanedione; keto esters such as methyl acetoacetate, ethyl acetoacetate, and butyl acetoacetate; hydroxycarboxylic acids and esters thereof, such as lactic acid, methyl lactate, salicylic acid, ethyl salicylate, phenyl salicylate, malic acid, tartaric acid, and methyl tartrate; keto alcohols such as 4-hydroxy-4-methyl-2-pentanone, 4-hydroxy-2-pentanone, 4-hydroxy-4-methyl-2-heptanone, and 4-hydroxy-2-heptanone; amino alcohol such as monoethanolamine, N,N-dimethylethanolamine, N-methyl-monoethanolamine, diethanolamine, and triethanolamine; enolic active compounds such as methylol melamine, methylol urea, methylol acrylamide, and malonic acid diethyl ester; and compounds having a substituent on a methyl group, a methylene group or a carbonyl carbon of acetylacetone (2,4-pentanedione).

Preferred ligands are acetylacetone derivatives, and the acetylacetone derivatives in the invention refer to compounds having a substituent on a methyl group, a methylene group or a carbonyl carbon of acetylacetone. Examples of the substituent that is substituted with a methyl group of acetylacetone include a linear or branched alkyl group, an acyl group, a hydroxyalkyl group, a carboxyalkyl group, an alkoxy group, and an alkoxyalkyl group, each of which has 1 to 3 carbon atoms. Examples of the substituent that is substituted with a methylene group of acetylacetone include a carboxyl group, and a linear or branched carboxyalkyl group and a hydroxyalkyl group, each of which has 1 to 3 carbon atoms. Examples of the substituent that is substituted with a carbonyl carbon of acetylacetone include an alkyl group having 1 to 3 carbon atoms, and in this case, a hydrogen atom is added to the carbonyl oxygen to become a hydroxyl group.

Specific examples of preferred acetylacetone derivatives include ethylcarbonylacetone, n-propylcarbonylacetone, i-propylcarbonylacetone, diacetylacetone, 1-acetyl-1-propionylacetylacetone, hydroxyethylcarbonylacetone, hydroxypropylcarbonylacetone, acetoacetic acid, acetopropionic acid, diacetoacetic acid, 3,3-diacetopropionic acid, 4,4-diacetobutyric acid, carboxyethylcarbonylacetone, carboxypropylcarbonylacetone, and diacetone alcohol. Among them, acetylacetone and diacetylacetone are particularly preferred. Complex of the acetylacetone derivative and the metal element is a mononuclear complex in which 1 to 4 molecules of the acetyl acetone derivatives are coordinated with one molecule of a metal element, and when the number of bonds of the metal element which is capable of being coordinated is larger than the sum of the number of bonds of the acetylacetone derivative which is capable of being coordinated, ligands that are generally used in conventional complexes, such as a water molecule, a halogen ion, a nitro group and an ammonio group, may be coordinated.

Preferred examples of the metal complex include tris (acetyl acetonato)aluminum complex salt, bis(acetyl acetonato)aluminum-aquo complex salt, mono(acetyl acetonato)aluminum-chloro complex salt, bis(diacetyl acetonato) aluminum complex salt, ethyl acetoacetate aluminum diisopropylate, aluminum tris(ethyl acetoacetate), cyclic aluminum oxide isopropylate, tris(acetyl acetonato)barium complex salt, bis(acetyl acetonato)titanium complex salt, tris (acetyl acetonato)titanium complex salt, di-i-propoxy-bis (acetyl acetonato)titanium complex salt, zirconium tris(ethyl acetoacetate), and zirconium tris(benzoic acid) complex salt. These have excellent stability in a water-based coating liquid and an excellent gelation accelerating effect in a sol-gel reaction at the time of heating and drying, but among these, particularly, ethyl acetoacetate aluminum diisopropylate, aluminum tris(ethyl acetoacetate), bis(acetyl acetonato)titanium complex salt, and zirconium tris(ethyl acetoacetate) are preferred.

Descriptions of counter salts of the metal complexes are omitted in the specification, but the kind of the counter salt is arbitrary as long as the counter salt is a water-soluble salt which maintains neutrality of the charge as a complex compound, and for example, the counter salt is used in the form of a salt that secures stoichiometric neutrality, such as a nitrate salt, a halide salt, a sulfate salt or a phosphate salt, is used.

In regard to the behavior of a metal complex in a silica sol-gel reaction, detailed descriptions are given in J. Sol-Gel. Sci. and Tec., 16, 209 (1999). The reaction mechanism is speculated to comply with the following scheme. That is, it is speculated that in a coating liquid, a metal complex is stabilized by adopting a coordination structure, and in a dehydration condensation reaction that starts in the process of heating and drying after application, crosslinking is accelerated by a mechanism that is similar to an acid catalyst. When the metal complex is used, a coating liquid having excellent stability over time, and a conductive layer having excellent coating film-surface-quality and high durability can be obtained.

The metal complex catalysts described above are easily available as commercially available products, and can also be obtained by known synthesis methods, for example, a reaction between various metal chlorides and alcohols.

The catalyst in the invention is preferably used in an amount in the range of from 0% to 50% by mass, and more preferably in the range of from 5% to 25% by mass, with respect to the non-volatile components in the sol-gel coating liquid. The catalysts may be used singly, or in combination of two or more kinds (Solvent)

The sol-gel coating liquid described above may optionally contain a solvent, in order to secure the ability to form a uniform-coating liquid-film on a substrate.

Examples of such a solvent include water, ketone-based solvents (for example, acetone, methyl ethyl ketone, and diethyl ketone), alcohol-based solvents (for example, methanol, ethanol, 2-propanol, 1-propanol, 1-butanol, and tert-butanol), chlorine-based solvents (for example, chloroform and dichloromethane), aromatic solvents (for example, benzene and toluene), ester-based solvents (for example, ethyl acetate, butyl acetate, and isopropyl acetate), ether-based solvents (for example, diethyl ether, tetrahydrofuran, and dioxane), and glycol ether-based solvents (for example, ethylene glycol monomethyl ether and ethylene glycol dimethyl ether).

In the coating liquid film of the sol-gel coating liquid formed on a substrate, the reaction of hydrolysis and condensation of the specific alkoxide compound proceeds, and in order to accelerate the reaction, it is preferable to heat and dry the coating liquid film. The heating temperature for accelerating the sol-gel reaction is suitable in the range of from 30° C. to 200° C., and more preferably in the range of from 50° C. to 180° C. The heating and drying time is preferably from 10 seconds to 300 minutes, and more preferably from 1 minute to 120 minutes.

As the non-photosensitive matrix, the sol-gel cured product is preferable from the viewpoint of obtaining a conductive layer having high film strength.

(Photosensitive Matrix)

Next, a photosensitive matrix is explained.

Preferred examples of the photosensitive matrix include photoresist compositions that are suitable for lithographic processes. When the photoresist composition is contained as a matrix, from the viewpoint that a conductive layer having a conductive region and a non-conductive region in a pattern form can be formed by a lithographic process, thus it is preferable. Among such photoresist compositions, particularly preferred examples include a photopolymerizable composition, from the viewpoint of obtaining a conductive layer having excellent transparency and flexibility and excellent adhesiveness to the base material. Hereinafter, the photopolymerizable composition is described.

(Photopolymerizable Composition)

The photopolymerizable compound contains, as basic components, (a) an addition-polymerizable unsaturated compound and (b) a photopolymerization initiator that generates a radical when irradiated with light, and further, optionally contains (c) a binder, and (d) other additives other than the components (a) to (c).

Hereinafter, these components are explained.

[(a) Addition-Polymerizable Unsaturated Compound]

The addition-polymerizable unsaturated compound of the component (a) (hereinafter, also referred to as a "polymerizable compound") is a compound which undergoes an addition-polymerization reaction in the presence of a radical to be polymerized. Generally, a compound having at least one, more preferably two or more, and even more preferably four or more, ethylenically unsaturated bonds, at a molecular end thereof is used.

These have chemical forms such as, for example, a monomer, a prepolymer, that is, a dimer, a trimer and an oligomer, or mixtures thereof.

Various compounds are known as such polymerizable compounds, and those can be used as the component (a).

Among these, particularly preferred polymerizable compounds include, from the viewpoint of film strength, trimethylolpropane tri(meth)acrylate, pentaerythritol tetra(meth)acrylate, dipentaerythritol hexa(meth)acrylate, and dipentaerythritol penta(meth)acrylate.

The content of the component (a) is preferably from 2.6% by mass to 37.5% by mass, and more preferably from 5.0% by mass to 20.0% by mass, with respect to the total mass of the solid content of the composition containing the metal conductive fibers described above.

[(b) Photopolymerization Initiator]

The photopolymerization initiator of the component (b) is a compound which generates a radical when irradiated with light. Examples of such a photopolymerization initiator include a compound which generates an acid radical that finally becomes an acid by light irradiation, and a compound which generates other radicals. Hereinafter, the former is called a "photoacid generator", and the latter is called a "photoradical generator".

—Photoacid Generator—

As the photoacid generator, a photoinitiator for photocationic polymerization, a photoinitiator for photoradical polymerization, a photo-achromatizing agent and a photo-discoloring agent for coloring matters, a known compound which generates an acid radical by irradiation with an active light or radiation which is used in microresists and the like, and a mixture thereof can be appropriately selected and used.

Such a photoacid generator is not particularly limited and can be appropriately selected according to the purpose. Examples thereof include triazine or 1,3,4-oxadiazole having at least one di- or tri-halomethyl group, naphthoquinone-1,2-diazide 4-sulfonyl halide, diazonium salts, phosphonium salts, sulfonium salts, iodonium salts, imide sulfonate, oxime sulfonate, diazodisulfone, disulfone, and o-nitrobenzyl sulfonate. Among these, imide sulfonate, oxime sulfonate, and o-nitrobenzyl sulfonate, which are compounds generating sulfonic acid, are particularly preferred.

Furthermore, a compound in which a group or compound which generates an acid radical by irradiation with an active light or a radiation is introduced into a main chain or a side chain of a resin, for example, the compounds described in U.S. Pat. No. 3,849,137, German Patent No. 3914407, JP-A Nos. S63-26653, S55-164824, S62-69263, S63-146038, S63-163452, S62-153853, and S63-146029 can be used.

Furthermore, the compounds described in U.S. Pat. No. 3,779,778, European Patent No. 126,712, and the like can also be used as acid radical generators.

—Photoradical Generator—

The photoradical generator is a compound having a function of directly absorbing light or of being photosensitized to cause a decomposition reaction or a dehydrogenation reaction, and generating a radical. The photoradical generator is preferably a compound having absorption in the wavelength region of from 200 nm to 500 nm.

As the photoradical generator, a large number of compounds are known, and examples thereof include the carbonyl compounds, ketal compounds, benzoin compounds, acridine compounds, organic peroxide compounds, azo compounds, coumarin compounds, azide compounds, metallocene compounds, hexaarylbiimidazole compounds, organic boric acid compounds, disulfonic acid compounds, oxime ester compounds, and acylphosphine (oxide) compounds as described in JP-A No. 2008-268884. These can be appropriately selected according to the purpose. Among these, benzophenone compounds, acetophenone compounds, hexaarylbiimidazole compounds, oxime ester compounds, and acylphosphine (oxide) compounds are particularly preferred from the viewpoint of exposure sensitivity.

Examples of the benzophenone compound include benzophenone, Michler's ketone, 2-methylbenzophenone, 3-methylbenzophenone, N,N-diethylaminobenzophenone, 4-methylbenzophenone, 2-chlorobenzophenone, 4-bromobenzophenone, and 2-carboxybenzophenone. These may be used singly, or two or more kinds may be used in combination.

Examples of the acetophenone compound include 2,2-dimethoxy-2-phenylacetophenone, 2,2-diethoxyacetophenone, 2-(dimethylamino)-2-[(4-methylphenyl)methyl]-1-[4-(4-morpholinyl)phenyl]-1-butanone, 1-hydroxycyclohexyl phenyl ketone, α-hydroxy-2-methylphenylpropanone, 1-hydroxy-1-methylethyl(p-isopropylphenyl) ketone, 1-hydroxy-1-(p-dodecylphenyl) ketone, 2-methyl-1-(4-methylthiophenyl)-2-morpholinopropan-1-one, 1,1,1-trichloromethyl-(p-butylphenyl) ketone, and 2-benzyl-2-dimethylamino-1-(4-morpholinophenyl)-butanone-1. As specific examples of commercially available products, IRGACURE 369, IRGACURE 379 and IRGACURE 907, all manufactured by BASF Corp., and the like are suitable. These may be used singly, or two or more kinds may be used in combination.

Examples of the hexaarylbiimidazole compound include the various compounds such as those described in Japanese Patent Application Publication (JP-B) No. H06-29285, U.S. Pat. Nos. 3,479,185, 4,311,783 and 4,622,286, and the like, specifically, 2,2'-bis(o-chlorophenyl)-4,4',5,5'-tetraphenylbiimidazole, 2,2'-bis(o-bromophenyl))-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole. These may be used singly, or two or more kinds may be used in combination.

Examples of the oxime ester compound include the compounds described in J. C. S. Perkin II (1979) 1653-1660, J. C. S. Perkin II (1979) 156-162, Journal of Photopolymer Science and Technology (1995) 202-232, and JP-A No. 2000-66385, and the compounds described in JP-A No. 2000-80068 and Japanese Patent Application National Publication (Laid-Open) No. 2004-534797. Specific examples that are suitable include IRGACURE OXE-01 and OXE-02, both manufactured by BASF Corp. These may be used singly, or two or more kinds may be used in combination.

Examples of the acylphosphine (oxide) compound include IRGACURE 819, DAROCUR 4265, and DAROCUR TPO, all manufactured by BASF Corp.

Particularly preferred examples of the photoradical generator include, from the viewpoints of exposure sensitivity and transparency, 2-(dimethylamino)-2-[(4-methylphenyl)methyl]-1-[4-(4-morpholinyl)phenyl]-1-butanone, 2-benzyl-2-dimethylamino-1-(4-morpholinophenyl)-butanone-1,2-methyl-1-(4-methylthiophenyl)-2-morpholinopropan-1-one, 2,2'-bis(2-chlorophenyl)-4,4',5,5'-tetraphenylbiimidazole, N,N-diethylaminobenzophenone, 1,2-octanedione, 1-[4-(phenylthio)-,2-(o-benzoyloxime)], and 2,4-bis(trichloromethyl)-6-[4-(N,N-diethoxycarbonylmethylamino)-3-bromophenyl]-s-triazine.

The photopolymerization initiator of the component (b) may be used singly, or two or more kinds may be used in combination. The content thereof is preferably from 0.1% by mass to 50% by mass, more preferably from 0.5% by mass to 30% by mass, and even more preferably from 1% by mass to 20% by mass, with respect to the total mass of the solid content of the photopolymerizable composition containing the metal conductive fibers. When the pattern including a conductive region and a non-conductive region which is described below is formed on the conductive layer within such a numerical value range, favorable sensitivity and pattern formability are obtained.

[(c) Binder]

The binder can be appropriately selected from alkali-soluble resins which are linear organic high molecular weight polymers and have at least one group which promotes alkali-solubility (for example, a carboxyl group, a phosphoric acid group, or a sulfonic acid group) in the molecule (preferably, a molecule having an acrylic copolymer or a styrene-based copolymer as the main chain).

Among these, a substance which is soluble in an organic solvent and soluble in an aqueous alkali solution is preferred, and a substance which has a dissociable group and becomes alkali-soluble when the dissociable group is dissociated under the action of a base, is particularly preferred. Here, a dissociable group represents a functional group capable of dissociation in the presence of a base.

In the preparation of the binder, for example, a method based on a known radical polymerization method can be applied. The polymerization conditions such as temperature, pressure, kind and amount of the radical initiator, and kind of the solvent, which are employed when an alkali-soluble resin is produced by the radical polymerization method, can be easily set up by a person having ordinary skill in the art, and the conditions can be experimentally determined.

The linear organic high molecular weight polymer is preferably a polymer having a carboxylic acid in a side chain thereof.

Examples of the polymer having a carboxylic acid in a side chain thereof include the methacrylic acid copolymers, acrylic acid copolymers, itaconic acid copolymers, crotonic acid copolymers, maleic acid copolymers, and partially esterified maleic acid copolymers described in JP-A No. S59-44615, JP-B Nos. S54-34327, S58-12577 and S54-25957, JP-A Nos. S59-53836 and S59-71048; acidic cellulose derivatives having a carboxylic acid in a side chain thereof; and polymers in which an acid anhydride is added to a polymer having a hydroxyl group. Further preferable examples thereof include high molecular weight polymers having a (meth)acryloyl group in a side chain thereof.

Among these, a benzyl(meth)acrylate/(meth)acrylic acid copolymer, and a multi-component copolymer formed from benzyl(meth)acrylate/(meth)acrylic acid/other monomers are particularly preferred.

Furthermore, examples that are useful include a high molecular weight polymer having a (meth)acryloyl group in a side chain thereof, and a multi-component copolymer formed from (meth)acrylic acid/glycidyl(meth)acrylate/other monomers. The polymers can be used by mixing in an arbitrary amount.

In addition to the compounds described above, examples thereof include the copolymer of 2-hydroxypropyl(meth)acrylate/polystyrene macromonomer/benzyl methacrylate/methacrylic acid, the copolymer of 2-hydroxy-3-phenoxypropyl acrylate/polymethyl methacrylate macromonomer/benzyl methacrylate/methacrylic acid, the copolymer of 2-hydroxyethyl methacrylate/polystyrene macromonomer/methyl methacrylate/methacrylic acid, and the copolymer of 2-hydroxyethyl methacrylate/polystyrene macromonomer/benzyl methacrylate/methacrylic acid, described in JP-A No. H07-140654.

As specific constituent units in the alkali-soluble resin, (meth)acrylic acid and other monomers that are capable of being copolymerized with the (meth)acrylic acid are preferable.

Examples of the other monomer that is capable of being copolymerized with (meth)acrylic acid include an alkyl (meth)acrylate, an aryl(meth)acrylate, and a vinyl compound. In these monomers, a hydrogen atom of the alkyl group and the aryl group may be substituted with a substituent.

Examples of the alkyl(meth)acrylate or aryl(meth)acrylate include methyl(meth)acrylate, ethyl(meth)acrylate, propyl (meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl (meth)acrylate, naphthyl(meth)acrylate, cyclohexyl(meth) acrylate, dicyclopentanyl(meth)acrylate, dicyclopentenyl (meth)acrylate, and dicyclopentenyloxyethyl(meth)acrylate. These may be used singly, or two or more kinds may be used in combination.

Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, polystyrene macromonomer, polymethyl methacrylate macromonomer, $CH_2=CR^1R^2$, and $CH_2=C(R^1)(COOR^3)$ [wherein $R^1$ represents a hydrogen atom or an alkyl group having 1 to 5 carbon atoms; $R^2$ represents an aromatic hydrocarbon ring having 6 to 10 carbon atoms; and $R^3$ represents an alkyl group having 1 to 8 carbon atoms or an aralkyl group having 6 to 12 carbon atoms]. These may be used singly, or in combination of two or more kinds The weight average molecular weight of the binder is preferably from 1,000 to 500,000, more preferably from 3,000 to 300,000, and even more preferably from 5,000 to 200,000, from the viewpoints of the alkali dissolution rate, the film properties, and the like.

Here, the weight average molecular weight can be determined by measuring by a gel permeation chromatography method using a standard polystyrene calibration curve.

The content of the binder of the component (c) is preferably from 5% by mass to 90% by mass, more preferably from 10% by mass to 85% by mass, and even more preferably from 20% by mass to 80% by mass, with respect to the total mass of the solid content of the photopolymerizable composition containing the metal conductive fibers. When the content is in the preferred content range, both developability and the conductivity of the metal conductive fibers can be achieved.

[(d) Other Additives Other than Components (a) to (c)]

Examples of other additives other than the components (a) to (c) include various additives such as a sensitizer, a chain transfer agent, a crosslinking agent, a dispersant, a solvent, a surfactant, an oxidation inhibitor, a sulfuration inhibitor, a metal corrosion inhibitor, a viscosity adjusting agent, and an antiseptic agent.

(d-1) Chain Transfer Agent

A chain transfer agent is used for an increase in the exposure sensitivity of the photopolymerizable composition. Examples of such a chain transfer agent include N,N-dialkylaminobenzoic acid alkyl esters such as N,N-dimethylaminobenzoic acid ethyl ester; mercapto compounds having a heterocyclic ring such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6-(1H,3H,5H)-trione; and aliphatic polyfunctional mercapto compounds such as pentaerythritol tetrakis(3-mercaptopropionate), pentaerythritol tetrakis(3-mercaptobutyrate), and 1,4-bis(3-mercaptobutyryloxy)butane. These may be used singly, and two or more kinds may be used in combination.

The content of the chain transfer agent is preferably from 0.01% by mass to 15% by mass, more preferably from 0.1% by mass to 10% by mass, and even more preferably from 0.5% by mass to 5% by mass, with respect to the total mass of the solid content of the photopolymerizable composition containing the metal conductive fibers.

(d-2) Crosslinking Agent

A crosslinking agent is a compound which forms chemical bonding by a free radical or an acid and heat, thereby curing the conductive layer. Examples thereof include melamine-based compounds, guanamine-based compounds, glycoluril-based compounds, urea-based compounds, phenolic compounds or phenolic ether compounds, epoxy-based compounds, oxetane-based compounds, thioepoxy-based compounds, isocyanate-based compounds, and azide-based compounds, each of which are substituted with at least one group selected from a methylol group, an alkoxymethyl group and an acyloxymethyl group; and compounds having an ethylenically unsaturated group that includes a methacryloyl group, an acryloyl group, or the like. Among these, from the viewpoints of the film properties, heat resistance and solvent resistance, epoxy-based compounds, oxetane-based compounds, and compounds having an ethylenically unsaturated group are particularly preferred.

The oxetane resin can be used singly, or can be mixed with an epoxy resin and used. Particularly, when the oxetane resin is used in combination with an epoxy resin, it is preferable from the viewpoint of having high reactivity and enhanced film properties.

When a compound having an ethylenically unsaturated-double bond group is used as a crosslinking agent, it should be noted that the crosslinking agent is also included in the (c) polymerizable compound, and the content thereof is included in the content of the (c) polymerizable compound, in the invention.

The content of the crosslinking agent is preferably from 1 part by mass to 250 parts by mass, and more preferably from 3 parts by mass to 200 parts by mass, with respect to the total mass of the solid content of the photopolymerizable composition containing the metal conductive fibers.

(d-3) Dispersant

A dispersant is used in order to disperse the metal conductive fibers in the photopolymerizable composition, while preventing aggregation of the metal conductive fibers. The dispersant is not particularly limited as long as it is capable of dispersing the metal conductive fibers, and can be appropriately selected according to the purpose. For example, those dispersants that are commercially available as pigment dispersants can be utilized, and particularly, a polymeric dispersant having a property of adsorbing to metal conductive fibers is preferred. Examples of such a polymeric dispersant include polyvinylpyrrolidone, BYK series (manufactured by BYK Chemie GmbH), SOLSPERSE series (manufactured by Lubrizol Japan, Ltd.), and AJISPER series (manufactured by Ajinomoto Co., Inc.).

When a polymeric dispersant as a dispersant is further added separately, apart from the dispersants used in the production of the metal conductive fibers, it should be noted that the polymeric dispersant is also included in the binder of the component (c), and the content thereof is included in the content of the component (c) described above.

The content of the dispersant is preferably from 0.1 parts by mass to 50 parts by mass, more preferably from 0.5 parts by mass to 40 parts by mass, and particularly preferably from 1 part by mass to 30 parts by mass, with respect to 100 parts by mass of the binder of the component (c).

When the content of the dispersant is 0.1 parts by mass or more, the aggregation of metal conductive fibers in the dispersion liquid is effectively suppressed, and when the content is 50 parts by mass or less, a liquid film that is stable in the coating process is formed, and the occurrence of coating unevenness is suppressed, thus it is preferable.

(d-4) Solvent

A solvent is a component which is used to be formed into a coating liquid for forming, on a surface of a base material, the photopolymerizable composition containing the metal conductive fibers into a film-form, and the solvent can be appropriately selected according to the purpose. Examples thereof include propylene glycol monomethyl ether, propylene glycol monomethyl ether acetate, ethyl 3-ethoxypropionate, methyl 3-methoxypropionate, ethyl lactate, 3-methoxybutanol, water, 1-methoxy-2-propanol, isopropyl acetate, methyl lactate, N-methylpyrrolidone (NMP), γ-butyrolactone (GBL), and propylene carbonate. These may be used singly, or two or more kinds may be used in combination.

The solid content concentration of the coating liquid containing such a solvent is preferably contained in the range of from 0.1% by mass to 20% by mass.

In addition, as the matrix, a polymer compound that is used as a dispersant at the time of production of the metal conductive fibers, can be used as at least a portion of the components that form the matrix.

The method of forming the aforementioned conductive layer on a base material can be carried out by a general coating method, and the method is not particularly limited and can be appropriately selected according to the purpose. Examples thereof include a roll coating method, a bar coating method, a dip coating method, a spin coating method, a casting method, a die coating method, a blade coating method, a gravure coating method, a curtain coating method, a spray coating method, and a doctor coating method.

<<Intermediate Layer>>

It is preferable that the conductive member further have at least one intermediate layer between the base material and the conductive layer. When an intermediate layer is provided between the base material and the conductive layer, an enhancement of at least one of the adhesiveness between the base material and the conductive layer, the total light transmittance of the conductive layer, the haze of the conductive layer, and the film strength of the conductive layer can be promoted.

Examples of the intermediate layer include an adhesive layer for increasing the adhesive force between the base material and the conductive layer, and a functional layer for enhancing functionality by an interaction with the components that are contained in the conductive layer. The intermediate layer is appropriately provided according to the purpose.

FIG. 1 is a schematic cross-sectional diagram illustrating a conductive member 1 according to the first exemplary embodiment of the invention. In FIG. 1, between a base material 10 and a conductive layer 20, an intermediate layer 30 which includes: a first adhesive layer 31 having excellent affinity with the base material 10; and a second adhesive layer 32 having excellent affinity with the conductive layer 20 is provided.

Figure 2:
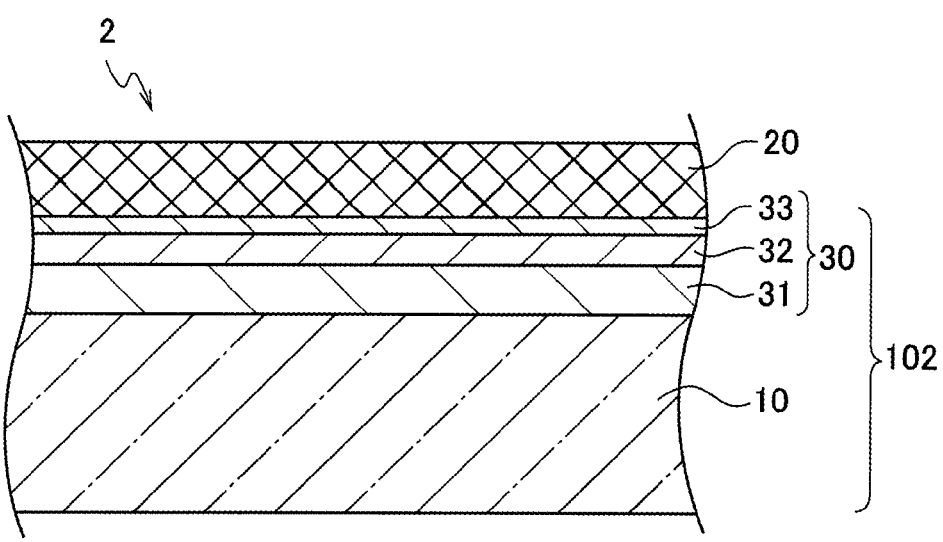
FIG. 2 is a schematic cross-sectional diagram of the conductive member according to a second exemplary embodiment of the invention.

FIG. 2 is a schematic cross-sectional diagram illustrating a conductive member 2 according to the second exemplary embodiment of the invention. In FIG. 2, between a base material 10 and a conductive layer 20, an intermediate layer 30 which is configured to include a functional layer 33 adjacent to the conductive layer 20 in addition to a first adhesive layer 31 and a second adhesive layer 32, which are similar to those of the first exemplary embodiment, is provided. The intermediate layer 30 in the present specification refers to a layer which is configured to include at least one layer selected from the group consisting of the first adhesive layer 31, the second adhesive layer 32, and the functional layer 33.

There are no particular limitations on the material used in the intermediate layer 30, and the material may be any material that enhances at least any one of the characteristics described above.

For example, when an adhesive layer is provided as an intermediate layer, a material selected from the group consisting of the polymers used in adhesives, silane coupling agents, titanium coupling agents, and a sol-gel film obtained by hydrolysis and polycondensation of an alkoxide compound of Si is included.

It is preferable that the intermediate layer that is in contact with the conductive layer (that is, the intermediate layer when the intermediate layer 30 is a single layer; and an intermediate layer that is in contact with the conductive layer when the intermediate layer 30 includes plural layers) is a functional layer 33 containing a compound having a functional group that is capable of interacting with the metal conductive fibers contained in the conductive layer 20, from the viewpoint that a conductive layer having excellent total light transmittance, haze and film strength is obtained. In the case of having such an intermediate layer, even if the conductive layer 20 contains metal conductive fibers and an organic polymer, a conductive layer having excellent film strength can be obtained.

The mechanism for this is not clear, but it is contemplated that when an intermediate layer which contains a compound having a functional group that is capable of interacting with the metal conductive fibers contained in the conductive layer 20 is provided, due to the interaction between the metal conductive fibers contained in the conductive layer and the compound having the above-described functional group contained in the intermediate layer, aggregation of the conductive materials in the conductive layer is suppressed, whereby uniform dispersibility is improved, a decrease in transparency or haze that is caused by aggregation of the conductive materials in the conductive layer is suppressed, and also, an increase in the film strength is achieved due to the adhesiveness. An intermediate layer that is capable of exhibiting such an interaction may be hereinafter referred to as a functional layer. Since the functional layer exhibits its effect as a result of an interaction with the conductive materials, when the functional layer is provided not only adjacent to the aforementioned conductive layer having a three-dimensional crosslinked structure in the invention, but also adjacent to the conductive layer containing metal conductive fibers and the organic polymer, the effect of the functional layer is exhibited.

As the functional group that is capable of interacting with the metal conductive fibers, for example, when the metal conductive fibers are silver nanowires, the functional group is more preferably at least one selected from the group consisting of an amide group, an amino group, a mercapto group, a carboxylic acid group, a sulfonic acid group, a phosphoric acid group, a phosphonic acid group and salts thereof. Even more preferably, the functional group is preferably an amino group, a mercapto group, a phosphoric acid group, a phosphonic acid group, or a salt thereof, and most preferably an amino group.

Examples of the compound having such a functional group include compounds having an amide group such as ureidopropyltriethoxysilane, polyacrylamide and polymethacrylamide; compounds having an amino group such as N-β-(aminoethyl)-γ-aminopropyltrimethoxysilane, 3-aminopropyltriethoxysilane, bis(hexamethylene)triamine, N,N'-bis(3-aminopropyl)-1,4-butanediamine tetrahydrochloride, spermine, diethylenetriamine, m-xylenediamine, and metaphenylenediamine; compounds having a mercapto group, such as 3-mercaptopropyltrimethoxysilane, 2-mecaptobenzothiazole, and toluene-3,4-dithiol; compounds having a group of sulfonic acid or a salt thereof such as poly(sodium p-styrenesulfonate) and poly(2-acrylamido-2-methylpropanesulfonic acid); compounds having a carboxylic acid group such as polyacrylic acid, polymethacrylic acid, polyaspartic acid, terephthalic acid, cinnamic acid, fumaric acid, and succinic acid; compounds having a phosphoric acid group such as PHOSMER PE, PHOSMER CL, PHOSMER M, PHOSMER MH, and polymers thereof, POLYPHOSMER M-101, POLYPHOSMER PE-201, and POLYPHOSMER MH-301; and compounds having a phosphonic acid group such as phenylphosphonic acid, decylphosphonic acid, methylenediphosphonic acid, vinylphosphonic acid, and allylphosphonic acid.

When these functional groups are selected, after a coating liquid for conductive layer-formation is applied, an interaction between the metal conductive fibers and the functional group contained in the intermediate layer occurs to suppress aggregation of the metal conductive fibers at the time of drying, whereby a conductive layer in which the metal conductive fibers are uniformly dispersed can be formed.

The intermediate layer can be formed by applying, onto a substrate, a liquid in which a compound that forms the intermediate layer is dissolved, or dispersed and emulsified; and drying. Regarding the coating method, a general method can be used. There are no particular limitations on the method, and the method can be appropriately selected according to the purpose. Examples thereof include a roll coating method, a bar coating method, a dip coating method, a spin coating method, a casting method, a die coating method, a blade coating method, a gravure coating method, a curtain coating method, a spray coating method, and a doctor coating method.

<<Laminated Body for Conductive Layer-Formation>>

Examples of other methods of forming the conductive layer on a base material include a method of separately preparing a laminated body for conductive layer-formation in which the conductive layer is formed on a surface of a base material for transfer, and transferring the conductive layer of the laminated body onto a surface of an arbitrary base material.

Such a laminated body for conductive layer-formation has a basic configuration in which a conductive layer is formed on a base material for transfer as described above; however, if necessary, the laminated body may also have a configuration in which, between the base material for transfer and the conductive layer, a cushion layer, an intermediate layer, or both of these layers are formed in this order, or a configuration in which a cover film is further formed on the conductive layer.

The method of forming the conductive layer on the surface of a base material for transfer can be carried out by the same coating method as in the case of the method of forming the conductive layer on the base material as described above.

<Base Material for Transfer>

The shape, structure, size and the like of the base material for transfer are not particularly limited, and can be appropriately selected according to the purpose. For example, examples of the shape include a film form, a sheet (film) form, and a plate form. Examples of the structure include a single layer structure, and a layered structure. The size can be appropriately selected according to the use or the like.

The material of the base material for transfer is not particularly limited and can be appropriately selected according to the purpose. Examples thereof include transparent glass, a synthetic resin, a metal, a ceramic, and a silicon wafer that is used as a semiconductor substrate. If desired, a pretreatment such as a chemical treatment with a silane coupling agent or the like, a plasma treatment, ion plating, sputtering, a vapor phase reaction method, or vacuum vapor deposition can be performed.

Examples of the transparent glass include white sheet glass, blue sheet glass, and silica coated blue sheet glass. In the case of a base material for transfer using such transparent glass, the base material may be a thin layer glass plate having a thickness of from 10 μm to several hundred μm.

Examples of the synthetic resin include polyethylene terephthalate (PET), a polycarbonate, triacetyl cellulose (TAC), a polyether sulfone, a polyester, an acrylic resin, a vinyl chloride resin, an aromatic polyamide resin, a polyamideimide, and a polyimide.

Examples of the metal include aluminum, copper, nickel, and stainless steel.

The total visible light transmittance of the base material for transfer is preferably 70% or higher, more preferably 85% or higher, and even more preferably 90% or higher. When the total visible light transmittance is less than 70%, there is a case that it is practically problematic due to the low transmittance.

In the invention, a base material for transfer which has been colored to the extent that the purpose of the invention is not impaired may also be used.

The average thickness of the base material for transfer is not particularly limited, and can be appropriately selected according to the purpose. However, the average thickness is preferably from 1 μm to 500 μm, more preferably from 3 μm to 400 μm, and even more preferably from 5 μm to 300 μm.

When the average thickness is in the range described above, handling is favorable and flexibility is excellent, whereby transfer uniformity is favorable.

<Cushion Layer>

The laminated body for conductive layer-formation may have, between the base material for transfer and the photosensitive layer, a cushion layer for an increase in transferring property. The shape, structure, size and the like of the cushion layer are not particularly limited, and can be appropriately selected according to the purpose. For example, examples of the shape include a film form and a sheet form.

Examples of the structure include a single layer structure and a layered structure. The size and the thickness can be appropriately selected according to the use or the like.

The cushion layer is a layer which accomplishes the role of enhancing transferring property to a transfer-receiving body, and the cushion layer contains at least a polymer, and if necessary, contains other components.

The polymer used in the cushion layer is not particularly limited as long as it is a thermoplastic resin that softens when heated, and can be appropriately selected according to the purpose. Examples thereof include an acrylic resin, a styrene-acrylic copolymer, polyvinyl alcohol, polyethylene, an ethylene-vinyl acetate copolymer, an ethylene-ethyl acrylate copolymer, an ethylene-methacrylic acid copolymer, polyvinyl chloride gelatin; cellulose esters such as cellulose nitrate, cellulose triacetate, cellulose diacetate, cellulose acetate butyrate, and cellulose acetate propionate; homopolymers or copolymers containing vinylidene chloride, vinyl chloride, styrene, acrylonitrile, vinyl acetate, (C1-C4) alkyl acrylate, and vinylpyrrolidone; a soluble polyester, a polycarbonate, and a soluble polyamide. These may be used singly, or two or more kinds may be used in combination.

The polymer used in the cushion layer is preferably a thermoplastic resin that softens by heating. The glass transition temperature of the cushion layer is preferably from 40° C. to 150° C. When the glass transition temperature is lower than 40° C., there is a case that the cushion layer becomes so soft that handling property is deteriorated. When the glass transition temperature is higher than 150° C., there is a case that the cushion layer is not softened by a thermal lamination system and transferring property of the conductive layer is deteriorated. The glass transition temperature may be adjusted by the addition of a plasticizer or the like.

Components other than those described above, which can be included the cushion layer, are not particularly limited and can be appropriately selected according to the purpose. Examples thereof include various additives such as a filler, a surfactant, an oxidation inhibitor, a sulfuration inhibitor, a metal corrosion inhibitor, a viscosity adjusting agent, and an antiseptic agent. Further examples thereof include the organic polymeric materials described in paragraph [0007] and thereafter of JP-A No. H05-72724, various plasticizers, supercooling materials, adhesion improving agents, surfactants, mold releasing agents, thermal polymerization inhibitors, and solvents, each of which is for adjusting the adhesive force to the base material for transfer.

The cushion layer can be formed by applying, onto a base material for transfer, a coating liquid for a cushion layer containing the polymer and the other components as necessary, and drying.

The average thickness of the cushion layer is preferably from 1 μm to 50 μm, more preferably from 1 μm to 30 μm, and even more preferably from 5 μm to 20 μm. When the average thickness is in the range described above, uniform transferring property is obtained, and the curl balance of the transfer material is also favorable.

Furthermore, it is preferable that the ratio (S/N) of the total average thickness S of the conductive layer and the cushion layer to the average thickness N of the base material for transfer satisfies the following Formula (1):

$$S/N = 0.01 \text{ to } 0.7 \quad \text{Formula (1)}$$

The S/N is more preferably in the range of from 0.02 to 0.6. When the ratio of S/N is 0.01 or more, favorable transfer-uniformity to the transfer-receiving body is obtained, and when the ratio S/N is 0.7 or less, an excellent curl balance is obtained.

It is preferable that the intermediate layer described above is included in a case in which the conductive layer contains a photoresist composition as a matrix. The intermediate layer is preferably formed from polyvinyl alcohol, polyvinylpyrrolidone or the like, and the thickness thereof is suitably in the range of from 0.1 µm to 5 µm.

The film thickness (average thickness) of the conductive layer is preferably from 0.001 µm to 2 µm, and more preferably from 0.005 µm to 1 µm. When the average thickness is 0.001 µm or more, the in-plane distribution of conductivity becomes uniform, and when the average thickness is 2 µm or less, favorable transparency is obtained.

The cover film described above is provided for the purpose of protecting the conductive layer from contamination or damage when the laminated body for conductive layer-formation is handled as a simple material. The cover film is detached before the laminated body is layered on the base material.

Preferred examples of the cover film include a polyethylene film and a polypropylene film, and the thickness thereof is suitably in the range of from 20 µm to 200 µm.

<Shape of Conductive Layer>

The shape of the conductive member according to the invention in the case of observing from a direction perpendicular to a surface of the base material may be either of a first embodiment in which the entire region of the conductive layer is a conductive region (hereinafter, the conductive layer is also referred to as a "non-patterned conductive layer"), or a second embodiment in which the conductive layer includes a conductive region and a non-conductive region (hereinafter, the conductive layer is also referred to as a "patterned conductive layer"). In the case of the second embodiment, the metal conductive fibers may be contained in the non-conductive region or are not necessarily contained in the non-conductive region. When the metal conductive fibers are contained in the non-conductive region, the metal conductive fibers contained in the non-conductive region are broken.

The conductive member according to the first embodiment can be used as, for example, a transparent electrode of a solar cell.

The conductive member according to the second embodiment is used in the case of, for example, producing a touch panel. In this case, a conductive region and a non-conductive region having a desired shape are formed.

[Conductive Layer Including Conductive Region and Non-Conductive Region (Patterned Conductive Layer)]

A patterned conductive layer is produced by, for example, the following patterning method.

(1) A patterning method of: forming a non-patterned conductive layer in advance; irradiating the metal conductive fibers contained in a desired region of this non-patterned conductive layer with high energy laser light such as a carbon dioxide laser, a YAG laser or the like; and breaking or eliminating a portion of the metal conductive fibers to form the desired region into a non-conductive region. The method is described in, for example, JP-A No. 2010-4496.

(2) A patterning method of: providing a photoresist layer on a non-patterned conductive layer that has been formed in advance; subjecting the photoresist layer to desired patternwise exposure and development to form a resist in such a patterned-form; and then removing by etching metal conductive fibers in the conductive layer in a region that is not protected by the resist by a wet processing of treating with an etching liquid capable of etching the metal conductive fibers or by a dry process such as reactive ion etching. The method is described in, for example, Japanese Patent Application National Publication (Laid-Open) No. 2010-507199 (particularly, paragraphs 0212 to 0217).

The methods of the above items (1) and (2) are convenient patterning methods in the case in which the conductive layer is composed of metal conductive fibers alone, and in the case in which the conductive layer contains metal conductive fibers and a non-photosensitive matrix (for example, an organic high molecular weight polymer).

The light source that is used for the patternwise exposure is selected in connection with the photosensitive wavelength range of the photoresist composition, and generally, ultraviolet radiation such as g-line, h-line, i-line or j-line is preferably used. Blue LED may also be used.

There are no particular limitations on the method of patternwise exposure, and the patternwise exposure may be carried out by surface exposure using a photomask, or may also be carried out by scanning exposure using a laser beam or the like. At this time, the exposure mode may be refraction type exposure using a lens, or may be reflection type exposure using a reflecting mirror, and exposure methods such as contact exposure, proximity exposure, reduction projection exposure, and reflection projection exposure can be used.

A dissolution liquid that dissolves the metal conductive fibers can be appropriately selected depending on the metal conductive fibers. For example, when the metal conductive fibers are silver nanowires, examples of the dissolution liquid include a bleaching-fixing liquid that is used mainly in a bleaching and fixing process of photographic paper of a silver halide color photosensitive material in the so-called photographic science industry, a strong acid, an oxidizing agent, and hydrogen peroxide. Among these, the bleaching-fixing liquid, dilute nitric acid, and hydrogen peroxide are particularly preferred. Regarding the dissolution of silver nanowires using a dissolution liquid that dissolves the metal conductive fibers, it is not necessary to completely dissolve silver nanowires in a part to which the dissolution liquid is applied, and a portion of the silver nanowires may remain as long as conductivity is lost.

The concentration of the dilute nitric acid is preferably from 1% by mass to 20% by mass.

The concentration of the hydrogen peroxide is preferably from 3% by mass to 30% by mass.

Regarding the bleaching-fixing liquid, for example, the treatment materials or treatment methods described in page 26, lower right column, line 1 to page 34, upper right column, line 9 of JP-A No. H02-207250, and page 5, upper left column, line 17 to page 18, lower right column, line 20 of JP-A No. H04-97355 can be preferably applied.

The bleaching-fixing time is preferably 180 seconds or shorter, more preferably 120 seconds or shorter and 1 second or longer, and even more preferably 90 seconds or shorter and 5 seconds or longer. The washing by water or stabilization time is preferably 180 seconds or shorter, and more preferably 120 seconds or shorter and 1 second or longer.

The bleaching-fixing liquid is not particularly limited as long as it is a photographic bleaching-fixing liquid, and can be appropriately selected according to the purpose. Examples thereof include CP-48S and CP-49E (bleaching-fixing agents for color paper) manufactured by Fujifilm Corp.; EKTA-COLOR RA bleaching-fixing liquid manufactured by Eastman Kodak Co.; and bleaching-fixing liquids D-J2P-02-P2, D-30P2R-01 and D-22P2R-01 manufactured by Dainippon Printing Co., Ltd. Among these, CP-48S and CP-49E are particularly preferred.

The viscosity at 25° C. of the dissolution liquid that dissolves the metal conductive fibers is preferably from 5 mPa·s to 300,000 mPa·s, and more preferably from 10 mPa·s to 150,000 mPa·s. When the viscosity is 5 mPa·s or greater, it is easier to control the diffusion of the dissolution liquid to a desired range, whereby patterning with clear boundaries between a conductive region and a non-conductive region is secured. When the viscosity is 300,000 mPa·s or less, performing printing of the dissolution liquid without any load is secured, and also, the treatment time required for the dissolution of the metal conductive fibers can be completed within a preferable time.

Patternwise application of the dissolution liquid that dissolves the metal conductive fibers is not particularly limited as long as the dissolution liquid can be applied patternwise, and can be appropriately selected according to the purpose. Examples thereof include screen printing, inkjet printing, and a method of forming an etching mask in advance using a resist agent or the like, and performing coater coating, roller coating, dipping coating, or spray coating, thereon using the dissolution liquid. Among these, screen printing, inkjet printing, coater coating, and dip (immersion) coating are particularly preferred.

As the inkjet printing, for example, a piezo mode or a thermal mode can be used.

The kind of the pattern is not particularly limited and can be appropriately selected according to the purpose. Examples thereof include characters, symbols, shapes, figures, and wiring patterns.

The size of the pattern is not particularly limited and can be appropriately selected according to the purpose. The size may be any size ranging from a nanometer size to a millimeter size.

In regard to the conductive member according to the invention, it is preferable that the surface resistance is adjusted to be 1000 Ω/square or less.

The surface resistance is a value obtained by measuring a surface of a side opposite to a side of the base material of the conductive layer in the conductive member according to the invention, by a four-probe method. The method of measuring the surface resistance according to a four-probe method can be carried out according to, for example, JIS K 7194:1994 (Method of testing resistivity of a conductive plastic by a four-probe method) or the like, and the surface resistance can be easily measured using a commercially available surface resistivity meter. In order for the surface resistance to be 1000 Ω/square or less, at least one of the kind and the content ratio of the metal conductive fibers contained in the conductive layer may be adjusted. More specifically, as described above, a conductive layer having a surface resistance in a preferable range can be formed by adjusting the content ratio of the compound represented by the above-described Formula (II) and the metal conductive fibers.

The surface resistance of the conductive member according to the invention is more preferably in the range of from 0.1 Ω/square to 900 Ω/square.

Since the conductive member according to the invention has a low haze value, the conductive member is widely applied to, for example, touch panels, electrodes for display, electromagnetic wave shields, electrodes for organic EL displays, electrodes for inorganic EL displays, electronic papers, electrodes for flexible displays, integrated type solar cells, liquid crystal display devices, display devices with a touch panel function, other various devices, and the like. Among these, application to touch panels and solar cells is particularly preferred.

<<Touch Panel>>

The conductive member according to the invention is applied to, for example, a surface type electrostatic capacitance system-touch panel, a transmission type electrostatic capacitance system-touch panel, a resistant film type touch panel, and the like. Here, the touch panel is meant to include so-called touch sensors and touch pads.

It is preferable that the layer configuration of the touch panel sensor-electrode unit in the touch panel is any of a bonding system of bonding two sheets of transparent electrodes, a system including transparent electrodes on both surfaces of one sheet of a base material, a single-surface jumper or through-hole system, and a single-surface lamination system.

The surface type electrostatic capacitance system-touch panel is described in, for example, Japanese Patent Application National Publication (Laid-Open) No. 2007-533044.

<<Solar Cell>>

The conductive member according to the invention is useful as a transparent electrode in an integrated type solar cell (hereinafter, also referred to as solar cell device).

There are no particular limitations on the integrated type solar cell, and those generally used as solar cell devices can be used. Examples thereof include a single crystal silicon-based solar cell device; a polycrystalline silicon-based solar cell device; an amorphous silicon-based solar cell device configured in single bonding type, tandem structure type, or the like; a Group III-V compound semiconductor solar cell device of gallium-arsenic (GaAs), indium-phosphor (InP) or the like; a Group II-VI compound semiconductor solar cell device of cadmium-tellurium (CdTe) or the like; a Group I-III-VI compound semiconductor solar cell device of copper/indium/selenium system (so-called CIS system), copper/indium/gallium/selenium system (so-called CIGS system), copper/indium/gallium/selenium/sulfur system (so-called CIGSS system) or the like; a dye-sensitized type solar cell device; and an organic solar cell device. Among these, in the invention, it is preferable that the solar cell device is an amorphous silicon-based solar cell device configured in tandem structure type or the like; and a Group I-III-VI compound semiconductor solar cell device of copper/indium/selenium system (so-called CIS system), copper/indium/gallium/selenium system (so-called CIGS system), copper/indium/gallium/selenium/sulfur system (so-called CIGSS system) or the like.

In the case of the amorphous silicon-based solar cell device configured in tandem structure type or the like, an amorphous silicon or micro-crystalline silicon thin film layer and a thin film in which Ge is contained therein, and a tandem structure having two or more such layers are used as the photoelectric conversion layer. Film formation is carried out using plasma CVD or the like.

The conductive member according to the invention can be applied to all of the solar cell devices described above. The conductive member may be included in any part of a solar cell device, but it is preferable that the conductive layer is disposed adjacent to the photoelectric conversion layer. With respect to the positional relationship with the photoelectric conversion layer, the configurations described below are preferred, but the invention is not limited to these. The configurations described below do not describe all the parts that form a solar cell device, and are described to the extent that the positional relationship of the transparent conductive layer is understood. Here, the configuration indicated inside brackets "[ ]" corresponds to the conductive member according to the invention.

(A) [Base material-conductive layer]-photoelectric conversion layer (B) [Base material-conductive layer]-photoelectric conversion layer-[conductive layer-base material]

(C) Substrate-electrode-photoelectric conversion layer-[conductive layer-base material]

(D) Back surface electrode-photoelectric conversion layer-[conductive layer-base material]

The details of such a solar cell are described in, for example, JP-A No. 2010-87105.

EXAMPLES

Hereinafter, Examples of the invention are described, but the invention is not intended to be limited to these Examples. The expression "%" and "parts" indicated as content ratios in the Examples section are on a mass basis. In addition, an addition liquid described in the following Examples section can be prepared as an addition liquid having any arbitrary amount by scale-up or scale-down while maintaining the composition ratio.

In the following Examples, the average diameter (average minor axis) and average major axis length of a metal nanowire, the coefficient of variation of the minor axis length, and the proportion of silver nanowires having an aspect ratio of 10 or greater were measured as described below.

<Average Minor Axis Length (Average Diameter) and Average Major Axis Length of Silver Nanowire>

300 silver nanowires were observed using a transmission electron microscope (TEM; manufactured by JEOL, Ltd., JEM-2000FX), and the average minor axis lengths and average major axis lengths of the silver nanowires were determined.

Example 1

<Coefficient of Variation of Minor Axis Length of Silver Nanowire>

The minor axis lengths of 300 silver nanowires were observed using a transmission electron microscope (TEM; manufactured by JEOL, Ltd., JEM-2000FX), and the amount of each silver that had been permeated through a filter paper was measured, whereby the amount of silver nanowires having a minor axis length of 50 nm or less and a major axis length of 5 μm or more was determined as the ratio (%) of silver nanowires having an aspect ratio of 10 or greater.

Separation of silver nanowires at the time of determining the proportion of silver nanowires was carried out using a membrane filter (manufactured by Millipore Corp., FALP 02500, pore size: 1.0 μm).

<Ratio of Silver Nanowire Having Aspect Ratio of 10 or Greater>

The minor axis lengths of 300 silver nanowires were observed using a transmission electron microscope (TEM; manufactured by JEOL, Ltd., JEM-2000FX), and the amount of each silver that had been permeated through a filter paper was measured, whereby the amount of silver nanowires having a minor axis length of 50 nm or less and a major axis length of 5 μm or more was determined as the ratio (%) of silver nanowires having an aspect ratio of 10 or greater.

Separation of silver nanowires at the time of determining the proportion of silver nanowires was carried out using a membrane filter (manufactured by Millipore Corp., FALP 02500, pore size: 1.0 μm).

<Preparation of Silver Nanowire-Aqueous Dispersion Liquid 1>

The following addition liquids A, G and H were prepared in advance.

[Addition Liquid A]

0.51 g of a silver nitrate powder was dissolved in 50 mL of pure water. Thereafter, 1 N aqueous ammonia was added thereto until the solution turned transparent. Then, pure water was added thereto such that the total amount was 100 mL.

[Addition Liquid G]

0.5 g of a glucose powder was dissolved in 140 mL of pure water, whereby addition liquid G was prepared.

[Addition Liquid H]

0.5 g of a HTAB (hexadecyltrimethylammonium bromide) powder was dissolved in 27.5 mL of pure water, whereby addition liquid H was prepared.

Next, a silver nanowire-aqueous dispersion liquid 1 was prepared as described below.

410 mL of pure water was introduced into a three-necked flask, and while the content of the flask was stirred at 20° C., 82.5 mL of the addition liquid H and 206 mL of the addition liquid G were added using a funnel (first stage). To this liquid, 206 mL of the addition liquid A was added at a flow rate of 2.0 mL/min and at a number of stirring-rotation of 800 rpm (second stage). After 10 minutes had passed, 82.5 mL of the addition liquid H was added thereto (third stage). Subsequently, the internal temperature was increased to 75° C. at a rate of 3° C./min. Thereafter, the number of stirring-rotation was decreased to 200 rpm, and the content of the flask was heated for 5 hours and then cooled to room temperature to perform synthesis of silver nanowires.

An ultrafiltration module SIP1013 (manufactured by Asahi Kasei Chemicals Corp., molecular weight cut-off: 6,000), a magnet pump, and a stainless steel cup were connected with tubes made of silicone, and thus an ultrafiltration apparatus was provided. 1 L of a reaction liquid of silver nanowires thus obtained was introduced into the stainless steel cup, and ultrafiltration was performed by operating the pump. At the time point when 100 mL of the filtrate from the module was collected, a washing operation of adding 100 mL of distilled water to the stainless steel cup was repeated 60 times, and then the resultant liquid was concentrated, whereby a silver nanowire-aqueous dispersion liquid 1 was obtained.

For the silver nanowire in the silver nanowire-aqueous dispersion liquid 1 thus obtained, the average minor axis length, the average major axis length, the ratio of silver nanowire having an aspect ratio of 10 or greater, and the coefficient of variation of the minor axis length of the silver nanowire were measured. The results are presented in Table 1.

TABLE 1

| | Average minor axis length (nm) | Average major axis length (μm) | Coefficient of variation (%) | Ratio of silver nanowire having aspect ratio of 10 or greater (%) |
|---|---|---|---|---|
| Silver nanowire of Preparation Example 1 | 17.5 | 36.8 | 18.3 | 83.2 |

<Identification and Quantification of Glucose by IR Spectroscopy>

The silver nanowire-aqueous dispersion liquid 1 thus obtained was centrifuged, and a powder obtained by inspissation of the supernatant was analyzed by IR spectroscopy. In the IR spectroscopy, absorption attributed to glucose or a glucose derivative was confirmed near 1050 $cm^{-1}$ and near 1350 $cm^{-1}$. Separately, standard samples were used to prepare a calibration curve, and it was confirmed that glucose or a glucose derivative existed in an amount of 0.01% with respect to Ag in the dispersion liquid.

<Preparation of Silver Nanowire-Aqueous Dispersion Liquid 2>

A silver nanowire-aqueous dispersion liquid 2 was prepared in the same manner as in the preparation of the silver nanowire-aqueous dispersion liquid 1, except that the washing operation by ultrafiltration was carried out 65 times. With respect to the silver nanowire-aqueous dispersion liquid 2, the absorption attributed to glucose or a glucose derivative was confirmed in the same manner as in the case of the silver nanowire-aqueous dispersion liquid 1, and it was confirmed that glucose or a glucose derivative existed in an amount of 0.005% with respect to Ag in the dispersion liquid.

<Preparation of Silver Nanowire-Aqueous Dispersion Liquid 3>

A silver nanowire-aqueous dispersion liquid 3 was prepared in the same manner as in the preparation of the silver nanowire-aqueous dispersion liquid 1, except that the washing operation by ultrafiltration was carried out 55 times. With respect to the silver nanowire-aqueous dispersion liquid 3, the absorption attributed to glucose or a glucose derivative was confirmed in the same manner as in the case of the silver nanowire-aqueous dispersion liquid 1, and it was confirmed that glucose or a glucose derivative existed in an amount of 0.05% with respect to Ag in the dispersion liquid.

<Preparation of Silver Nanowire-Aqueous Dispersion Liquid C1>

A silver nanowire-aqueous dispersion liquid C1 was prepared in the same manner as in the preparation of the silver nanowire-aqueous dispersion liquid 1, except that the washing operation by ultrafiltration was carried out 90 times. With respect to the silver nanowire-aqueous dispersion liquid C1, the absorption attributed to glucose or a glucose derivative was examined in the same manner as in the case of the silver nanowire-aqueous dispersion liquid 1. However, the absorption near 1050 $cm^{-1}$ and near 1350 $cm^{-1}$ attributed to glucose or a glucose derivative was not confirmed, and the presence of glucose or a glucose derivative was not confirmed.

<Preparation of Silver Nanowire-Aqueous Dispersion Liquid C2>

A silver nanowire-aqueous dispersion liquid C2 was prepared in the same manner as in the preparation of the silver nanowire-aqueous dispersion liquid C1, except that the washing operation by ultrafiltration was carried out 40 times. With respect to the silver nanowire-aqueous dispersion liquid C2, the absorption attributed to glucose or a glucose derivative was confirmed in the same manner as in the case of the silver nanowire-aqueous dispersion liquid 1, and it was confirmed that glucose or a glucose derivative existed in an amount of 0.1% with respect to Ag in the dispersion liquid.

<Preparation of Silver Nanowire-Aqueous Dispersion Liquid 4>

A silver nanowire-aqueous dispersion liquid 4 was obtained by adding glucose to the silver nanowire-aqueous dispersion liquid C1 such that the content of glucose was 0.01% with respect to silver in the dispersion liquid.

<Preparation of Silver Nanowire-Aqueous Dispersion Liquid 5>

A silver nanowire-aqueous dispersion liquid 5 was obtained in the same manner as in the preparation of the silver nanowire-aqueous dispersion liquid 4, except that fructose was used instead of glucose.

<Preparation of Silver Nanowire-Aqueous Dispersion Liquid 6>

A silver nanowire-aqueous dispersion liquid 6 was obtained in the same manner as in the preparation of the silver nanowire-aqueous dispersion liquid 1, except that washing by centrifugation was carried out instead of the washing operation by ultrafiltration. The washing operation by centrifugation was carried out by repeating three times a process of centrifuging the aqueous dispersion thus obtained, removing a portion of the supernatant equivalent to approximately 90% of the total weight, adding pure water again, and dispersing. The absorption attributed to glucose or a glucose derivative was confirmed in the same manner as in the case of the silver nanowire-aqueous dispersion liquid 1, and it was confirmed that glucose or a glucose derivative existed in an amount of 0.01% with respect to Ag in the dispersion liquid.

<Preparation of Silver Nanowire-Aqueous Dispersion Liquid C3>

30 mL of ethylene glycol was introduced into a three-necked flask and was heated to 160° C. Thereafter, 18 mL of an ethylene glycol solution containing 36 mM PVP (K-55), 3 µM iron acetylacetonate and 60 µM sodium chloride, and 18 mL of an ethylene glycol solution containing 24 mM silver nitrate were added to the flask at a rate of 1 mL per minute. The mixture was heated at 160° C. for 60 minutes, and then the mixture was cooled to room temperature.

Subsequently, washing was carried out by ultrafiltration in the same manner as in the preparation of the silver nanowire-aqueous dispersion liquid 1, and thus a silver nanowire-aqueous dispersion liquid C3 was obtained.

The silver nanowires in the silver nanowire-aqueous dispersion liquid C3 thus obtained had an average minor axis length of 110 nm and an average major axis length of 32 µm.

<Preparation of Silver Nanowire-Aqueous Dispersion Liquid 7>

A silver nanowire-aqueous dispersion liquid 7 was obtained by adding glucose to the silver nanowire-aqueous dispersion liquid C3 such that the content of glucose was 0.01% with respect to silver in the dispersion liquid.

<Preparation of Silver Nanowire-Aqueous Dispersion Liquid 8>

30 mL of ethylene glycol was introduced into a three-necked flask and was heated to 160° C. Thereafter, 18 mL of an ethylene glycol solution containing 36 mM PVP (K-55), 3 µM iron acetylacetonate and 60 µM sodium chloride, 18 mL of an ethylene glycol solution containing 40 mM glucose, and 18 mL of an ethylene glycol solution containing 24 mM silver nitrate were added to the flask at a rate of 1 mL per minute. The mixture was heated at 160° C. for 60 minutes, and then the mixture was cooled to room temperature.

Subsequently, washing was carried out by ultrafiltration in the same manner as in the preparation of the silver nanowire-aqueous dispersion liquid C3, except that the number of washing processes was changed to 65 times, whereby a silver nanowire-aqueous dispersion liquid 8 was obtained.

The silver nanowires in the silver nanowire-aqueous dispersion liquid 8 thus obtained had an average minor axis length of 115 nm and an average major axis length of 31 µm. Furthermore, the absorption attributed to glucose or a glucose derivative was confirmed in the same manner as in the case of the silver nanowire-aqueous dispersion liquid 1, and it was confirmed that glucose or a glucose derivative existed in an amount of 0.1% with respect to Ag in the dispersion liquid.

<Preparation of Silver Nanowire-Aqueous Dispersion Liquid C4>

A silver nanowire-aqueous dispersion liquid C4 was prepared in the same manner as in the preparation of the silver nanowire-aqueous dispersion liquid 8, except that the washing operation by ultrafiltration was carried out 95 times. With respect to the silver nanowire-aqueous dispersion liquid C4, the absorption attributed to glucose or a glucose derivative was examined in the same manner as in the case of the silver nanowire-aqueous dispersion liquid 1. However, the absorption near 1050 cm$^{-1}$ and near 1350 cm$^1$ attributed to glucose or a glucose derivative was not confirmed, and the presence of glucose or a glucose derivative was not confirmed.

<Preparation of Silver Nanowire-Dispersion Liquid 9>

30 mL of deionized water was introduced into an internal cylinder made of TEFLON (registered trademark), and to this, 5 mL of a 0.02 mol/L aqueous solution of silver nitrate as a silver salt raw material and 1.0 mL of a 0.2 mol/L aqueous solution of sodium chloride as a chlorine-containing substance were added dropwise. 0.4 millimoles of glucose was added thereto as a monosaccharide reducing agent. Thereafter, the internal cylinder made of TEFLON (registered trademark) was placed in a pressure resistant reactor made of stainless steel, and then the mixture was allowed to react for 24 hours at 160° C.

Subsequently, washing by ultrafiltration was performed in the same manner as in the preparation of the silver nanowire-aqueous dispersion liquid 1, except that the number of the washing operation was changed to 70 times, whereby a silver nanowire-aqueous dispersion liquid 9 was obtained.

The silver nanowires in the silver nanowire-aqueous dispersion liquid 9 thus obtained had an average minor axis length of 186 nm and an average major axis length of 34 μm. Furthermore, the absorption attributed to glucose or a glucose derivative was confirmed in the same manner as in the case of the silver nanowire-aqueous dispersion liquid 1, and it was confirmed that glucose or a glucose derivative existed in an amount of 0.01% with respect to Ag in the dispersion liquid.

<Preparation of Silver Nanowire-Aqueous Dispersion Liquid C5>

A silver nanowire-aqueous dispersion liquid C5 was obtained in the same manner as in the preparation of the silver nanowire-aqueous dispersion liquid 9, except that the number of the washing operation by ultrafiltration was 100 times. With respect to the silver nanowire-aqueous dispersion liquid C5, the absorption attributed to glucose or a glucose derivative was examined in the same manner as in the case of the silver nanowire-aqueous dispersion liquid 1. However, the absorption near 1050 cm$^{-1}$ and near 1350 cm$^{-1}$ attributed to glucose or a glucose derivative was not confirmed, and the presence of glucose or a glucose derivative was not confirmed.

<Preparation of Silver Nanowire-Aqueous Dispersion Liquid 10>

A silver nanowire-aqueous dispersion liquid 10 was obtained by adding glucose to the silver nanowire-aqueous dispersion liquid C5 such that the content of glucose was 0.01% with respect to silver in the dispersion liquid.

<<Production of Conductive Member>>

<Production of Conductive Member 1>

—Production of PET Substrate 101 Having Configuration Shown in FIG. 1—

A solution for adhesion 1 was prepared in accordance with the following composition.

[Solution for Adhesion 1]

| | |
|---|---|
| TAKELAC WS-4000 (polyurethane for coating, solid content concentration: 30%, manufactured by Mitsui Chemicals, Inc.) | 5.0 parts |
| Surfactant (NAROACTY HN-100, manufactured by Sanyo Chemical Industries., Ltd.) | 0.3 parts |
| Surfactant (SANDET BL, solid content concentration: 43%, manufactured by Sanyo Chemical Industries, Ltd.) | 0.3 parts |
| Water | 94.4 parts |

One surface of a PET film 10 having a thickness of 125 μm was subjected to a corona discharge treatment, and onto the surface on which a corona discharge treatment was performed, the solution for adhesion 1 described above was applied and dried for 2 minutes at 120° C., whereby a first adhesive layer 31 having a thickness of 0.11 μm was formed.

A solution for adhesion 2 was prepared in accordance with the following composition.

[Solution for Adhesion 2]

| | |
|---|---|
| Tetraethoxysilane (KBE-04, manufactured by Shin-Etsu Chemical Co., Ltd.) | 5.0 parts |
| 3-Glycidoxypropyltrimethoxysilane (KBM-403, manufactured by Shin-Etsu Chemical Co., Ltd.) | 3.2 parts |
| 2-(3,4-epoxycyclohexyl)ethyltrimethoxysilane (KBM-303, manufactured by Shin-Etsu Chemical Co., Ltd.) | 1.8 parts |
| Aqueous solution of acetic acid (acetic acid concentration = 0.05%, pH = 5.2) | 10.0 parts |
| Curing agent (boric acid, manufactured by Wako Pure Chemical Industries, Ltd.) | 0.8 parts |
| Colloidal silica (SNOWTEX O, average particle diameter: 10 nm to 20 nm, solid content concentration: 20%, pH = 2.6, manufactured by Nissan Chemical Industries, Ltd.) | 60.0 parts |
| Surfactant (NAROACTY HN-100, manufactured by Sanyo Chemical Industries, Ltd.) | 0.2 parts |
| Surfactant (SANDET BL, solid content concentration: 43%, manufactured by Sanyo Chemical Industries, Ltd.) | 0.2 parts |

The solution for adhesion 2 was prepared by the following method. While the aqueous solution of acetic acid was agitated vigorously, 3-glycidoxypropyltrimethoxysilane was added dropwise to the aqueous solution of acetic acid over 3 minutes. Subsequently, 2-(3,4-epoxycyclohexyl)ethyltrimethoxysilane was added to the aqueous solution of acetic acid over 3 minutes while agitated vigorously. Subsequently, tetramethoxysilane was added to the aqueous solution of acetic acid over 5 minutes while agitated vigorously, and thereafter, the mixture was continuously agitated for 2 hours. Next, colloidal silica, the curing agent, and the surfactants were sequentially added thereto, to prepare a solution for adhesion 2.

The surface of the first adhesive layer 31 described above was subjected to a corona discharge treatment, and then, onto the surface, the solution for adhesion 2 was applied by a bar coating method. The solution for adhesion 2 thus applied was heated and dried at 170° C. for one minute to form a second adhesive layer 32 having a thickness of 0.5 μm, whereby a PET substrate 101 having the configuration illustrated in FIG. 1 was obtained.

A solution of an alkoxide compound having the following composition was agitated at 60° C. for one hour, and it was confirmed that the solution was uniform. 3.44 parts of the sol-gel solution thus obtained was mixed with 16.56 parts of the silver nanowire-aqueous dispersion liquid 1 described above, and the mixture was further diluted with distilled water, to obtain a sol-gel coating liquid 1. The surface of the second adhesive layer 32 of the PET substrate 101 was subjected to a corona discharge treatment, and, onto that surface, the sol-gel coating liquid 1 was applied by a bar coating method such that the amount of silver was 0.02 g/m$^2$, and the total solid content coating amount was 0.150 g/m$^2$. Subsequently, the applied sol-gel coating liquid 1 was dried at 175° C. for one minute to induce a sol-gel reaction, whereby a conductive layer 20 was formed. Thus, a conductive member 1 having the configuration illustrated in the cross-sectional diagram of FIG. 1 was obtained. The mass ratio of compound (II)/metal conductive fibers in the conductive layer was 6.5/1.

<Solution of Alkoxide Compound>

| | |
|---|---|
| Tetraethoxysilane (compound (II)) (KBE-04, manufactured by Shin-Etsu Chemical Co., Ltd.) | 5.0 parts |
| 1% aqueous solution of acetic acid | 10.0 parts |
| Distilled water | 4.0 parts |

<Production of Conductive Members 2 to 9 and Conductive Members C1 to C5>

Conductive members 2 to 9 and conductive members C1 to C5 were each produced in the same manner as in the production of the conductive member 1, except that the silver nanowire-aqueous dispersion liquids 2 to 8 or silver nanowire-aqueous dispersion liquids C1 to C5 were respectively used, instead of the silver nanowire-aqueous dispersion liquid 1 used in the preparation of the sol-gel coating liquid 1.

<<Patterning>>

Each of the conductive members obtained as described above was subjected to a patterning treatment by the following method. For screen printing, WHT-3 type and SQUEE-GEE No. 4 Yellow manufactured by Mino Group Co., Ltd. were used. The silver nanowire-dissolution liquid for formation of patterning was formed by mixing CP-48S-A liquid and CP-48S-B liquid (all manufactured by Fujifilm Corp.) with pure water at a ratio of 1:1:1, and the mixture was thickened with hydroxyethyl cellulose, to prepare an ink for screen printing. As for the pattern mesh used, a stripe pattern (line/space=50 μm/50 μm) was used. The patterning treatment was carried out, whereby a patterned conductive member including a conductive layer having a conductive region and a non-conductive region was obtained. These members are referred to as patterned conductive members 1 to 9 and conductive members C1 to C5.

<<Evaluation>>

For each of the conductive members thus obtained, the surface resistance value, total light transmittance and haze value were measured by the methods described below, and the conductive members were evaluated with the grade described below. The evaluation results are shown in Table 2.

<Surface Resistance Value>

The surface resistance of the conductive layer was measured using LORESTA-GP MCP-T600 manufactured by Mitsubishi Chemical Corp., and the results were rated by the following criteria.

Rank 5: A surface resistance value of less than 30 Ω/square, which is a pre-eminent level.
Rank 4: A surface resistance value of from 30 Ω/square to less than 60 Ω/square, which is an excellent level.
Rank 3: A surface resistance value of from 60 Ω/square to less than 200 Ω/square, which is an acceptable level.
Rank 2: A surface resistance value of from 200 Ω/square to less than 1000 Ω/square, which is a slightly problematic level.
Rank 1: A surface resistance value of 1000 Ω/square or greater, which is a problematic level.

<Total Light Transmittance>

The total light transmittance (%) of the conductive member and the total light transmittance (%) of the PET substrate 101 before the conductive layer 20 was formed were measured using HAZE-GARD PLUS manufactured by BYK Gardner GmbH, and the total light transmittance was calculated from the ratio, whereby the conductive members were rated by the following criteria. Measurement was carried out at a measurement angle of 0° with respect to the CIE luminosity function y under C light source, and the results were rated according to the following criteria.

Rank A: A transmittance of 90% or higher, which is a favorable level.
Rank B: A transmittance of from 85% to lower than 90%, which is a slightly problematic level.

<Haze Value>

The haze value of rectangular solid exposed regions of the conductive film thus obtained was measured using HAZE-GARD PLUS manufactured by BYK Gardner GmbH, and the results were rated according to the following criteria.

Rank S: A haze value of from 0.5% to less than 1.0%, which is a pre-eminent level. Regarding the rank S, the values of the haze value were shown in conjunction with the rank S.
Rank A: A haze value of from 1.0% to less than 1.5%, which is an excellent level.
Rank B: A haze value of from 1.5% to less than 2.0%, which is a favorable level.
Rank C: A haze value of from 2.0% to less than 2.5%, which is a slightly problematic level.

TABLE 2

| Conductive member | Silver nanowire-aqueous dispersion liquid | Monosaccharide Kind | Content (%) | Method of incorporation | Preparation of silver nanowire-aqueous dispersion liquid Preparation of silver nanowires | Method of washing | Evaluation Surface resistance value | Total light transmittance | Haze value | Remarks |
|---|---|---|---|---|---|---|---|---|---|---|
| 1 | 1 | Glucose | 0.01 | Adjustment of washing ratio | Water-based | Ultrafiltration | 5 | A | S (0.8%) | Invention |
| 2 | 2 | Glucose | 0.005 | Adjustment of washing ratio | Water-based | Ultrafiltration | 5 | A | S (0.9%) | Invention |
| 3 | 3 | Glucose | 0.05 | Adjustment of washing ratio | Water-based | Ultrafiltration | 5 | A | S (0.9%) | Invention |
| 4 | 4 | Glucose | 0.01 | Addition after washing | Water-based | Ultrafiltration | 5 | A | S (0.9%) | Invention |
| 5 | 5 | Glucose | 0.01 | Adjustment of washing ratio | Water-based | Centrifugation | 5 | A | S (0.95%) | Invention |
| 6 | 6 | Fructose | 0.01 | Addition after washing | Water-based | Ultrafiltration | 5 | A | S (0.95%) | Invention |
| 7 | 7 | Glucose | 0.01 | Addition after washing | Polyol method | Ultrafiltration | 4 | A | S (0.95%) | Invention |
| 8 | 8 | Glucose | 0.01 | Adjustment of washing ratio | Polyol method | Ultrafiltration | 4 | A | S (0.9%) | Invention |
| 9 | 9 | Glucose | 0.01 | Adjustment of washing ratio | Hydrothermal method | Ultrafiltration | 4 | A | S (0.9%) | Invention |

TABLE 2-continued

| Conductive member | Silver nanowire-aqueous dispersion liquid | Monosaccharide Kind | Monosaccharide Content (%) | Monosaccharide Method of incorporation | Preparation of silver nanowire-aqueous dispersion liquid Preparation of silver nanowires | Preparation of silver nanowire-aqueous dispersion liquid Method of washing | Evaluation Surface resistance value | Evaluation Total light transmittance | Evaluation Haze value | Remarks |
|---|---|---|---|---|---|---|---|---|---|---|
| 10 | 10 | Glucose | 0.01 | Addition after washing | Hydrothermal method | Ultrafiltration | 4 | A | S (0.95%) | Invention |
| C1 | C1 | Glucose | 0 | — | Water-based | Ultrafiltration | 5 | A | A | Comparative Example |
| C2 | C2 | Glucose | 0.1 | Adjustment of washing ratio | Water-based | Ultrafiltration | 5 | A | A | Comparative Example |
| C3 | C3 | — | — | — | Polyol method | Ultrafiltration | 4 | A | A | Comparative Example |
| C4 | C4 | Glucose | 0 | — | Polyol method | Ultrafiltration | 4 | A | A | Comparative Example |
| C5 | C5 | Glucose | 0 | — | Hydrothermal method | Ultrafiltration | 4 | A | A | Comparative Example |

From the results shown in Table 2, it can be understood that the conductive members according to the invention are excellent in all of conductivity, total light transmittance and haze value, and have particularly excellent haze values. Furthermore, in the case that the monosaccharide remains as a result of adjusting the washing ratio, and the case the same amount of the monosaccharide is added after washing, as it is clearly understood from comparisons between the conductive member 1 and the conductive member 4, between the conductive member 7 and the conductive member 8, and between the conductive member 9 and the conductive member 10, the haze value is slightly smaller when the monosaccharide remains as a result of adjusting the washing ratio. From this, although this mechanism is not clear, it is assumed that the presence of oxide of a monosaccharide used for reducing silver has an effect of further improving the haze property.

Example 2

<Production of Laminated Body for Conductive Layer-Formation>
<Formation of Cushion Layer>
Onto a polyethylene terephthalate film (base material for transfer) having a thickness of 75 μm, a coating liquid for thermoplastic resin layer of the following formulation 1 was applied, and the applied coating liquid was dried at 100° C. for 2 minutes and then further dried at 120° C. for one minute, whereby a cushion layer formed from a thermoplastic resin layer having a dry layer thickness of 16.5 μm was formed. Here, the temperatures "100° C." and "120° C." with regard to the drying conditions are both substrate temperatures. The same also applies to the temperatures given in the following drying conditions.
<Formulation 1 for Coating Liquid for Thermoplastic Resin Layer>

| | |
|---|---|
| Methyl methacrylate/2-ethylhexyl acrylate/benzyl methacrylate/methacrylic acid copolymer (=55/11.7/4.5/28.8 [molar ratio], mass average molecular weight: 90,000) | 58.4 parts |
| Styrene/acrylic acid copolymer (=63/37 [molar ratio], mass weight average molecular weight: 8,000) | 136 parts |
| 2,2-Bis[4-(methacryloxypolyethoxy)phenyl]propane | 90.7 parts |
| Surfactant: MEGAFACE F-780-F (manufactured by Dainippon Ink & Chemicals, Inc.) | 5.4 parts |
| Methanol | 111 parts |
| 1-Methoxy-2-propanol | 63.4 parts |
| Methyl ethyl ketone | 534 parts |

<Formation of Intermediate Layer>
Next, a coating liquid for an intermediate layer of the following formula 2 was applied onto the cushion layer thus formed, and the applied coating liquid was dried at 80° C. for one minute and further dried at 120° C. for one minute, whereby an intermediate layer having a dry layer thickness of 1.6 μm was formed.
<Formulation 2 for Coating Liquid for Intermediate Layer>

| | |
|---|---|
| Polyvinyl alcohol (PVA-205, degree of saponification: 88%, manufactured by Kuraray Co., Ltd.) | 3.22 parts |
| Polyvinylpyrrolidone (PVP K-30, manufactured by ISP Japan, Ltd.) | 1.49 parts |
| Methanol | 42.9 parts |
| Distilled water | 52.4 parts |

<Formation of Conductive Layer>
—Preparation of PGMEA Dispersion Liquid of Silver Nanowires—
To 100 parts of the silver nanowire-aqueous dispersion liquid 1 described above, 1 part of polyvinylpyrrolidone (K-30, manufactured by Tokyo Chemical Industry Co., Ltd.) and 100 parts of n-propanol were added, and the mixture was concentrated with a cross-flow filtering machine (manufactured by NGK Insulators, Ltd.) using a ceramic filter until the mixture was 10 parts. Subsequently, an operation of adding 100 parts of n-propanol and 100 parts of ion-exchanged water and concentrating the mixture again with a cross-flow filtering machine until the mixture was 10 parts, was repeated three times. Furthermore, 1 part of the binder (A-1) that is described below and 10 parts of n-propanol were added thereto, and the mixture was centrifuged. Subsequently, the solvent of the supernatant was removed by decantation, PGMEA was added to the residue, and redispersion of the mixture was performed. The procedure of performing from centrifugation to redispersion was repeated three times, and PGMEA was added at the last time, whereby a PGMEA dispersion liquid of silver nanowires was obtained. The addition amount of the final addition of PGMEA was adjusted such that the content of silver was 2% in terms of silver. The content of the polymer used as a dispersant was 0.05%. Hereinafter, when it is described as "silver nanowire-PGMEA dispersion liquid", the term represents the silver nanowire-PGMEA dispersion liquid obtained by the method described above.

<Photopolymerizable Composition>

A photopolymerizable composition having the following composition was prepared.

| | |
|---|---|
| Polymer: (Binder (A-1) obtained in Synthesis Example described below, a PGMEA solution with a solid content of 45%) | 44.50 parts |
| Polymer: (Binder (A-2) obtained in Synthesis Example described above, a PGMEA-MFG mixed solution with a solid content of 45%) | 44.50 parts |
| Polymerizable compound: Dipentaerythritol hexaacrylate | 8.01 parts |
| Photopolymerization initiator: 2,4-Bis(trichloromethyl)-6-[4-(N,N-diethoxycarbonylmethylamino)-3-bromophenyl]-s-triazine | 0.79 parts |
| Polymerization inhibitor: Phenothiazine | 0.062 parts |
| Surfactant: MEGAFACE F784F (manufactured by DIC Corp.) | 2.70 parts |
| Surfactant: SOLSPERSE 20000 (manufactured by Lubrizol Japan, Ltd.) | 1.00 parts |
| Solvent (PGMEA) | 48.42 parts |
| Solvent (MEK) | 100.00 parts |

3.21 parts of the photopolymerizable composition thus obtained, 6.41 parts of the silver nanowire-PGMEA dispersion liquid, and 40.38 parts of the solvent (PGMEA/MEK=1/1) were mixed and stirred, whereby a coating liquid for photopolymerizable conductive layer was obtained.

The coating liquid for polymerizable conductive layer obtained as described above was applied onto the PET substrate by bar coating such that the solid content coating amount of the photopolymerizable composition was 0.175 g/m$^2$, and the amount of silver was 0.035 g/m$^2$, and the applied coating liquid was dried at room temperature for 5 minutes. In this manner, a laminated body for conductive layer-formation was produced. Here, the amount of silver in the non-patterned conductive layer was 0.035 g/m$^2$, and the solid content coating amount of the photopolymerizable composition was 0.175 g/m$^2$.

In the laminated body thus obtained, the value of ratio S/N, in which the ratio S/N is the average value S of the total layer thickness of the conductive layer containing a photosensitive matrix and the cushion layer, and the average value N of the thickness of the base material for transfer, was 0.223.

<Synthesis of Binder (A-1)>

AA (9.64 g) and BzMA (35.36 g) were used as monomer components that form a copolymer, AIBN (0.5 g) was used as a radical polymerization initiator, and these were subjected to a polymerization reaction in a solvent of PGMEA (55.00 g), whereby a PGMEA solution of a binder (A-1) (solid content concentration: 45% by mass) was obtained. The polymerization temperature was adjusted to a temperature of from 60° C. to 100° C.

The molecular weight was measured using a gel permeation chromatographic method (GPC), and as a result, the weight average molecular weight (Mw) calculated was 11,000 in terms of polystyrene, the molecular weight distribution (Mw/Mn) was 1.72, and the acid value was 155 mg KOH/g.

Binder (A-1)

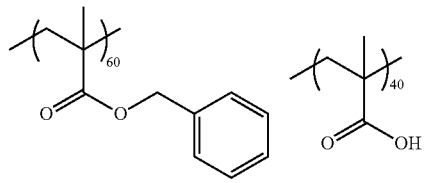

<<Production of Conductive Member 11>>

A conductive member 11 having a patterned conductive layer on a base material was produced using the laminated body for conductive layer-formation, by conducting a transfer process, an exposure process, a development process, and a post-baking process as described below.

(Transfer Process)

The surface of the PET substrate obtained in Preparation Example 4 and the laminated body for conductive layer-formation were superimposed and layered such that the surface of the PET substrate contacted the surface of the non-patterned conductive layer of the laminated body for conductive layer-formation, and the members were layered, whereby a laminated body having a layered structure of PET (base material for transfer)/cushion layer/intermediate layer/non-patterned conductive layer/PET (base material) was formed.

Subsequently, the PET (base material for transfer) was detached from the laminated body.

(Exposure Process)

The non-patterned conductive layer on the PET (base material) was exposed, through the cushion layer and the intermediate layer, using i-line (365 nm) of an ultrahigh pressure mercury lamp at an amount of exposure of 40 mJ/cm$^2$. Here, the exposure of the photosensitive layer was carried out from the cushion layer side through a mask, and the mask had a uniform-exposure section for the evaluation of conductivity, optical characteristics and film strength, and a striped pattern (line/space=50 μm/50 μm) for patternability evaluation.

(Development Process)

A 1% aqueous solution of triethanolamine was applied to the sample after exposure, whereby the thermoplastic resin layer (cushion layer) and the intermediate layer were dissolved and removed. The shortest removal time for completely removing these layers was 30 seconds.

Next, the photosensitive resin layer was developed by performing shower developing at a cone type nozzle pressure of 0.15 MPa at a temperature of 20° C. for 30 seconds, using a sodium (Na) carbonate-based developer liquid (containing 0.06 mol/liter sodium hydrogen carbonate, sodium carbonate having the same concentration, 1% sodium dibutyl naphthalenesulfonate, an anionic surfactant, a defoamant, and a stabilizer; trade name: T-CD1, manufactured by Fujifilm Corp.), and then was dried at room temperature. Subsequently, a heat treatment was performed at 100° C. for 15 minutes, whereby a conductive member 11 was obtained.

With respect to the conductive member 11, the surface resistance value, total light transmittance and haze value were evaluated in the same manner as in the case of Example 1. As a result, the surface resistance value was 5, the total light transmittance was A, and the haze value was S (0.85%). It was confirmed that the conductive member 11 was excellent as a conductive member.

Example 3

<Production of Integrated Type Solar Cell>
—Production of Amorphous Solar Cell (Super Straight Type)—

On a glass substrate, a conductive layer was formed in the same manner as in the case of the conductive member 1, whereby a transparent conductive film was formed. However, a patterning treatment was not performed, whereby the film was produced as a transparent conductive film that was uniform over the entire surface. A p-type amorphous silicon film having a film thickness of about 15 nm, an i-type amorphous silicon film having a film thickness of about 350 nm, and an n-type amorphous silicon film having a film thickness of about 30 nm were formed thereon by a plasma CVD method, and a gallium-added zinc oxide layer having a thickness of 20 nm and a silver layer having a thickness of 200 nm were formed as back surface reflective electrodes, whereby a photoelectric conversion element 101 was produced.

—Production of CIGS Solar Cell (Sub-Straight Type)—

On a soda lime glass substrate, there were formed a molybdenum electrode having a film thickness of about 500 nm by a direct current magnetron sputtering method; a Cu(In0.6Ga0.4)Se2 thin film, which is a chalcopyrite-based semiconductor material, having a film thickness of about 2.5 µm by a vacuum vapor deposition method; and a cadmium sulfide thin film having a film thickness of about 50 nm by a solution precipitation method.

A conductive layer was formed thereon in the same manner as in the case of the conductive member 1, whereby a transparent conductive film was formed on the glass substrate. Thus, a photoelectric conversion element 201 was produced.

Next, each of the solar cells thus produced was evaluated for the conversion efficiency in the manner described below. The results are shown in Table 5.

<Evaluation of Solar Cell Characteristics (Conversion Efficiency)>

Each of the solar cells was irradiated with 100 mW/cm$^2$ of pseudo-sunlight at AM1.5, and thus the conversion efficiency was measured. Each of the photoelectric conversion elements 101 and 201 exhibited high conversion efficiencies of 9%.

Example 4

—Production of Touch Panel—

A transparent conductive film was formed in the same manner as in the case of the conductive member 1, except that a glass substrate was used as the base material. A touch panel was produced using the transparent conductive film thus obtained, by the method described in "*Saishin Tacchi Paneru Gijutsu* (Latest Touch Panel Technology)" (published Jul. 6, 2009, Techno Times Corp.); "*Tacchi Paneru no Gijutsu to Kaihatsu* (Technology and Development of Touch Panel)", CMC Publishing, Inc. (published December 2004), supervised by Yuji MITANI; "FPD International 2009 Forum T-11 Lecture Textbook"; "Cypress Semiconductor Corporation; Application Note AN2292", and the like.

When the touch panel thus produced was used, it was found that a touch panel having excellent visibility due to an increase in light transmittance, and having excellent responsiveness to the input of characters or the like, or to screen operation, by at least one of a bare hand, a gloved hand and a pointing tool, due to an increase in conductivity, can be produced.

Industrial Applicability

The conductive member according to the invention has excellent transparency, conductivity and durability (film strength), when the conductive member is used by itself or used as a transfer material. Therefore, the conductive member can be suitably used for the production of, for example, a patterned transparent conductive film, a touch panel, an antistatic material for displays, an electromagnetic wave shield, an electrode for organic EL displays, an electrode for inorganic EL displays, an electronic paper, an electrode for flexible displays, an antistatic film for flexible displays, a display element, and an integrated type solar cell.

The entire disclosure of Japanese Patent Application No. 2011-212875 is incorporated herein by reference.

All publications, patent applications, and technical standards mentioned in this specification are here incorporated by reference to the same extent as if each individual publication, patent application, or technical standard was specifically and individually indicated to be incorporated by reference.

The invention claimed is:

1. A conductive composition comprising:
    a) metal conductive fibers having an average minor axis length of from 1 nm to 150 nm; and
    b) at least one compound selected from the group consisting of a monosaccharide and a derivative thereof, in an amount of from 0.005% by mass to 0.05% by mass with respect to the metal conductive fibers.

2. The conductive composition according to claim 1, wherein the metal conductive fibers comprise metal nanowires.

3. The conductive composition according to claim 1, wherein the derivative of the monosaccharide is an oxide of the monosaccharide.

4. The conductive composition according to claim 1, wherein the monosaccharide is glucose.

5. The conductive composition according to claim 1, wherein the metal conductive fibers comprise silver nanowires.

6. A method of producing a conductive composition comprising: a) metal conductive fibers having an average minor axis length of from 1 nm to 150 nm, and b) at least one compound selected from the group consisting of a monosaccharide and a derivative thereof, in an amount of from 0.005% by mass to 0.05% by mass with respect to the metal conductive fibers, the method comprising:
    1) preparing a reaction product comprising metal nanowires by reduction of a metal salt in the presence of at least one compound selected from the group consisting of a monosaccharide and a derivative thereof; and
    2) washing the reaction product such that a residual amount of the at least one compound selected from the group consisting of a monosaccharide and a derivative thereof is in a range of from 0.005% by mass to 0.05% by mass with respect to the metal nanowires.

7. The method of producing a conductive composition according to claim 6, wherein the washing is carried out by ultrafiltration.

8. The method of producing a conductive composition according to claim 6, wherein the reduction is carried out in an aqueous medium.

9. The method of producing a conductive composition according to claim 6, wherein the metal nanowires are silver nanowires.

10. A conductive member comprising a base material, and a conductive layer that is provided on the base material and contains the conductive composition according to claim 1.

11. The conductive member according to claim 10, wherein a surface resistance of the conductive layer is 1000 Ω/square or less.

12. The conductive member according to claim 10, wherein the conductive layer includes a conductive region and a non-conductive region.

13. The conductive member according to claim 10, further comprising at least one intermediate layer between the base material and the conductive layer.

14. A touch panel comprising the conductive member according to claim 10.

15. A solar cell comprising the conductive member according to claim 10.

* * * * *